United States Patent
Ohori et al.

(10) Patent No.: US 11,507,795 B2
(45) Date of Patent: Nov. 22, 2022

(54) RECORDING MEDIUM RECORDING SIMULATION PROGRAM, SIMULATION METHOD, AND INFORMATION PROCESSING DEVICE FOR PEOPLE FLOW IN SIGN SYSTEM

(71) Applicant: FUJITSU LIMITED, Kawasaki (JP)

(72) Inventors: Kotaro Ohori, Chuo (JP); Shohei Yamane, Kawasaki (JP); Hiroaki Yamada, Kawasaki (JP); Shingo Takahashi, Shinjuku (JP)

(73) Assignee: FUJITSU LIMITED, Kawasaki (JP)

( * ) Notice: Subject to any disclaimer, the term of this patent is extended or adjusted under 35 U.S.C. 154(b) by 401 days.

(21) Appl. No.: 16/590,333

(22) Filed: Oct. 1, 2019

(65) Prior Publication Data
US 2020/0034682 A1  Jan. 30, 2020

Related U.S. Application Data

(63) Continuation of application No. PCT/JP2018/008163, filed on Mar. 2, 2018.

(30) Foreign Application Priority Data

Apr. 6, 2017 (JP) .............................. JP2017-076313

(51) Int. Cl.
*G06F 30/20* (2020.01)
*G06Q 50/26* (2012.01)
*G06N 3/00* (2006.01)

(52) U.S. Cl.
CPC ............. *G06N 3/006* (2013.01); *G06F 30/20* (2020.01); *G06Q 50/26* (2013.01)

(58) Field of Classification Search
CPC ........ G06N 3/006; G06F 30/20; G08G 1/005; G06Q 90/20; G06Q 50/26
See application file for complete search history.

(56) References Cited

U.S. PATENT DOCUMENTS

| 2006/0200378 A1* | 9/2006 | Sorensen | G06Q 30/02 705/7.29 |
| 2009/0306946 A1* | 12/2009 | Badler | G06N 3/004 703/2 |
| 2018/0173828 A1 | 6/2018 | Ohori et al. | |

FOREIGN PATENT DOCUMENTS

| EP | 3336796 A1 | 6/2018 |
| JP | 2005-050117 A | 2/2005 |

(Continued)

OTHER PUBLICATIONS

Lin et al. "Pedestrian Guiding Signs Optimization for Airport Terminal". Hindawi Publishing Corporation Discrete Dynamics in Nature and Society. vol. 2014, Article ID 125910, 14 pages. http://dx.doi.org/10.1155/2014/125910 (Year: 2014).*

(Continued)

*Primary Examiner* — Eunhee Kim
(74) *Attorney, Agent, or Firm* — Fujitsu Patent Center

(57) ABSTRACT

A recording medium records a simulation program for causing a computer to execute a process including: arranging an agent, which has cognitive information and behaves in a virtual space based on the cognitive information, in the virtual space in which a plurality of guidance displays is set; when, with respect to each of the plurality of guidance displays, the agent enters within a first range of the respective guidance displays, and first guidance information corresponding to the first range is related with a destination of the agent, changing cognitive information up to the destination of the agent; and when, with respect to each of the plurality of guidance displays, the agent enters within a second range different from the first range, and second guidance information corresponding to the second range is related with the destination of the agent, changing cognitive information not directly related with the destination of the agent.

9 Claims, 41 Drawing Sheets

(56) References Cited

FOREIGN PATENT DOCUMENTS

| JP | 2009-093341 A | 4/2009 |
|---|---|---|
| JP | 2009-181187 A | 8/2009 |
| WO | 2017/029698 A1 | 2/2017 |

OTHER PUBLICATIONS

Schrom-Feiertag, Helmut, et al. "Using cognitive agent-based simulation for the evaluation of indoor wayfinding systems." arXiv preprint arXiv:1611.02459 (2016). (Year: 2016).*

Motamedi et al. "Signage visibility analysis and optimization system using BIM-enabled virtual reality (VR) environments". Advanced Engineering Informatics 32 (2017) 248-262. (Year: 2017).*

Raubal, Martin. "Human wayfinding in unfamiliar buildings: a simulation with a cognizing agent." Cognitive Processing 2.3 (2001): 363-388. (Year: 2001).*

EPOA—Office Action of European Patent Application No. 18780672.4 dated Oct. 2, 2020. ** All references cited in the EPOA were previously submitted in the IDS filed on Apr. 6, 2020 and Oct. 1, 2019.

JPOA—Office Action of Japanese Patent Application No. 2017-076313 dated Jun. 2, 2020 with machine translation. ** All references cited in the JPOA were previously submitted in the IDS filed on Oct. 1, 2019.

Shin Morishata et al.,"Complex Systems,No. 9",vol.32, No. 4,pp. 33-35 p. 33(left col. lines 12-14); p. 34(left col. line 30 to middle col. line 19); and p. 34(middle col. line 32 to right col. line 7), Apr. 2000 (4 pages) (Cited in ISR).

International Search Report and Written Opinion of the International Searching Authority (Form PCT/ISA/210, 220, and 237), mailed in connection with PCT/JP2018/008163 and dated May 22, 2018 (13 pages).

EESR—The Extended European Search Report of European Patent Application No. 18780672.4 dated Jan. 7, 2020. **WO2017/029698A1—cited in EESR was previously submitted in the IDS filed on October 1, 2019.

Kotaro Ohori, et al., "An Agent-Based Analysis of the Effectiveness of Signage Systems in a Large-Scale Facility", Social Simulation Conference 2016.

* cited by examiner

FIG. 2

CELL ENVIRONMENT

| AREA OF VIRTUAL SPACE | NUMBER OF FLOORS |
|---|---|
| 300×100 | 2 |

| WALL NUMBER | POSITION OF WALL |
|---|---|
| 1 | (10,10,1) |
| 2 | (20,20,1) |

11

NETWORK ENVIRONMENT

| NODE NUMBER | POSITION | TYPE |
|---|---|---|
| 1 | (5,10,1) | Waypoint |
| 2 | (5,15,1) | Waypoint |
| ⋮ | ⋮ | ⋮ |
| 200 | (280,95,2) | Facility |

| EDGE NUMBER | NODE A | NODE B |
|---|---|---|
| 1 | 1 | 2 |
| 2 | 2 | 1 |
| ⋮ | ⋮ | ⋮ |
| 650 | 199 | 200 |

FIG. 3

| SIGN NUMBER | POSITION | INFORMATION TRANSMITTABLE RANGE | | RECOGNIZABLE RANGE | | FACILITY INFORMATION | GUIDANCE INTENTION |
|---|---|---|---|---|---|---|---|
| | | DISTANCE | ANGLE | DISTANCE | ANGLE | | |
| 1 | (20,80,10) | 10 | 2/3π | 30 | 2/3π | 0: AREA (RESTAURANT) | 0: ARROW TYPE |
| 2 | (100,40,50) | 6 | 2/3π | 50 | 1/3π | 0 TO 50: ALL FACILITIES | 1: MAP TYPE |
| ... | ... | ... | ... | ... | ... | ... | ... |
| 20 | | | | | | | |

| OCCURRENCE PROBABILITY OF PEDESTRIAN AGENT |
|---|
| 0.8 |

| PEDESTRIAN CLASSIFICATION | OCCURRENCE RATIO | VISUAL RECOGNITION DISTANCE | VIEWING ANGLE | DESTINATION |
|---|---|---|---|---|
| 1 | 0.1 | 100 | 2Π | 0: AREA (RESTAURANT) |
| 2 | 0.1 | ... | ... | 1: AREA (EXCHANGE) |
| ... | ... | | | |
| 10 | 0.1 | | | |

FIG. 13A

| PEDESTRIAN ID | STEP NUMBER | SIGN NUMBER | FACILITY INFORMATION | GUIDANCE INTENTION | DESTINATION | DEGREE OF COINCIDENCE |
|---|---|---|---|---|---|---|
| A0001 | STEP0001 | | | | 0: AREA (RESTAURANT) | |
| | STEP0020 | P3-1 | 0: RESTAURANT | 0: ARROW TYPE | 0: AREA (RESTAURANT) | 1 |
| | STEP0020 | P3-2 | 0: RESTAURANT | 1: MAP TYPE | 0: AREA (RESTAURANT) | 1 |
| | STEP0020 | P3-3 | 3: CLOTHES SECTION | 0: ARROW TYPE | 0: AREA (RESTAURANT) | 1/4 |
| | STEP0020 | P3-4 | 3: CLOTHES SECTION | 1: MAP TYPE | 0: AREA (RESTAURANT) | 1/4 |

FIG. 13B

| VISUAL RECOGNITION DISTANCE | VIEWING ANGLE | MOVING DIRECTION | POSITION INFORMATION | |
|---|---|---|---|---|
| 10 | 2π | RW | (X1,Y1,Z1) | |
| 10 | 2π | O: RESTAURANT | (X20,Y20,Z20) | ←(1) |
| 10 | 2π | O: RESTAURANT | (X30,Y30,Z30) | ←(2) |
| 10 | 2π | RW | (X40,Y40,Z40) | ←(3) |
| 10 | 2π | RW | (X50,Y50,Z50) | ←(4) |

FIG. 16

| PEDESTRIAN ID | STEP NUMBER | SIGN NUMBER | FACILITY INFORMATION | GUIDANCE INTENTION | DESTINATION | DEGREE OF COINCIDENCE |
|---|---|---|---|---|---|---|
| A0001 | STEP0001 | | | | 0: AREA (RESTAURANT) | |
| | STEP0020 | P3-1 | 0: RESTAURANT | 0: ARROW TYPE | 0: AREA (RESTAURANT) | 1 |
| | STEP0030 | P3-1 | 0: RESTAURANT | 0: ARROW TYPE | 0: AREA (RESTAURANT) | 1 |

| VISUAL RECOGNITION DISTANCE | VIEWING ANGLE | MOVING DIRECTION | POSITION INFORMATION | |
|---|---|---|---|---|
| 10 | 2π | RW | (X1,Y1,Z1) | |
| 10 | π/6 | P3-1 | (X20,Y20,Z20) | ←(1) |
| 10 | 2π | 0: RESTAURANT | (X30,Y30,Z30) | ←(2) |

FIG. 22

| STORE NUMBER | POSITION | INFORMATION TRANSMITTABLE RANGE | | RECOGNIZABLE RANGE | | SERVICE INFORMATION | PERCEPTUAL INFORMATION |
|---|---|---|---|---|---|---|---|
| | | DISTANCE | ANGLE | DISTANCE | ANGLE | | |
| 1 | (20,80,60) | 10 | $2/3\Pi$ | 30 | $2/3\Pi$ | 0: WESTERN FOOD | 0: SMELL OF WESTERN FOOD |

FIG. 23

| PEDESTRIAN CLASSIFICATION | VISUAL RECOGNITION DISTANCE | VIEWING ANGLE | DESTINATION |
|---|---|---|---|
| 1 | 100 | 2π | 0: WANTING TO EAT HAMBURGER STEAK |
| 2 | 100 | 2π | 1: WANTING TO EAT RAMEN |

FIG. 25

| PEDESTRIAN ID | STEP NUMBER | STORE NUMBER | SERVICE INFORMATION | PERCEPTUAL INFORMATION | DESTINATION |
|---|---|---|---|---|---|
| A0001 | STEP0001 | | | | 0: WANTING TO EAT HAMBURGER STEAK |
| | STEP0020 | T1 | 0: WESTERN FOOD | 0: SMELL OF WESTERN FOOD | 0: WANTING TO EAT HAMBURGER STEAK |
| | STEP0020 | T2 | 1: CHINESE FOOD | 1: SMELL OF RAMEN | 0: WANTING TO EAT HAMBURGER STEAK |

| DEGREE OF COINCIDENCE | VISUAL RECOGNITION DISTANCE | VIEWING ANGLE | MOVING DIRECTION | POSITION INFORMATION | |
|---|---|---|---|---|---|
| | 10 | 2Π | RW | (X1,Y1,Z1) | |
| 1 | 10 | 2Π | T1 | (X40,Y40,Z40) | ←(1) |
| 0 | 10 | 2Π | RW | (X30,Y30,Z30) | ←(2) |

FIG. 27

| PEDESTRIAN ID | STEP NUMBER | STORE NUMBER | SERVICE INFORMATION | PERCEPTUAL INFORMATION | DESTINATION |
|---|---|---|---|---|---|
| A0001 | STEP0001 | | | | 0: WANTING TO EAT HAMBURGER STEAK |
| | STEP0020 | T1 | 0: WESTERN FOOD | 0: SMELL OF WESTERN FOOD | 0: WANTING TO EAT HAMBURGER STEAK |
| | STEP0020 | T2 | 1: CHINESE FOOD | 1: SMELL OF RAMEN | 0: WANTING TO EAT HAMBURGER STEAK |

| DEGREE OF COINCIDENCE | VISUAL RECOGNITION DISTANCE | VIEWING ANGLE | MOVING DIRECTION | POSITION INFORMATION | |
|---|---|---|---|---|---|
| | | | | (X1,Y1,Z1) | |
| 1 | 10 | 2Π | T1 | (X40,Y40,Z40) | ←(1) |
| 0 | 10 | 2Π | CONTRARY TO T2 | (X30,Y30,Z30) | ←(2) |

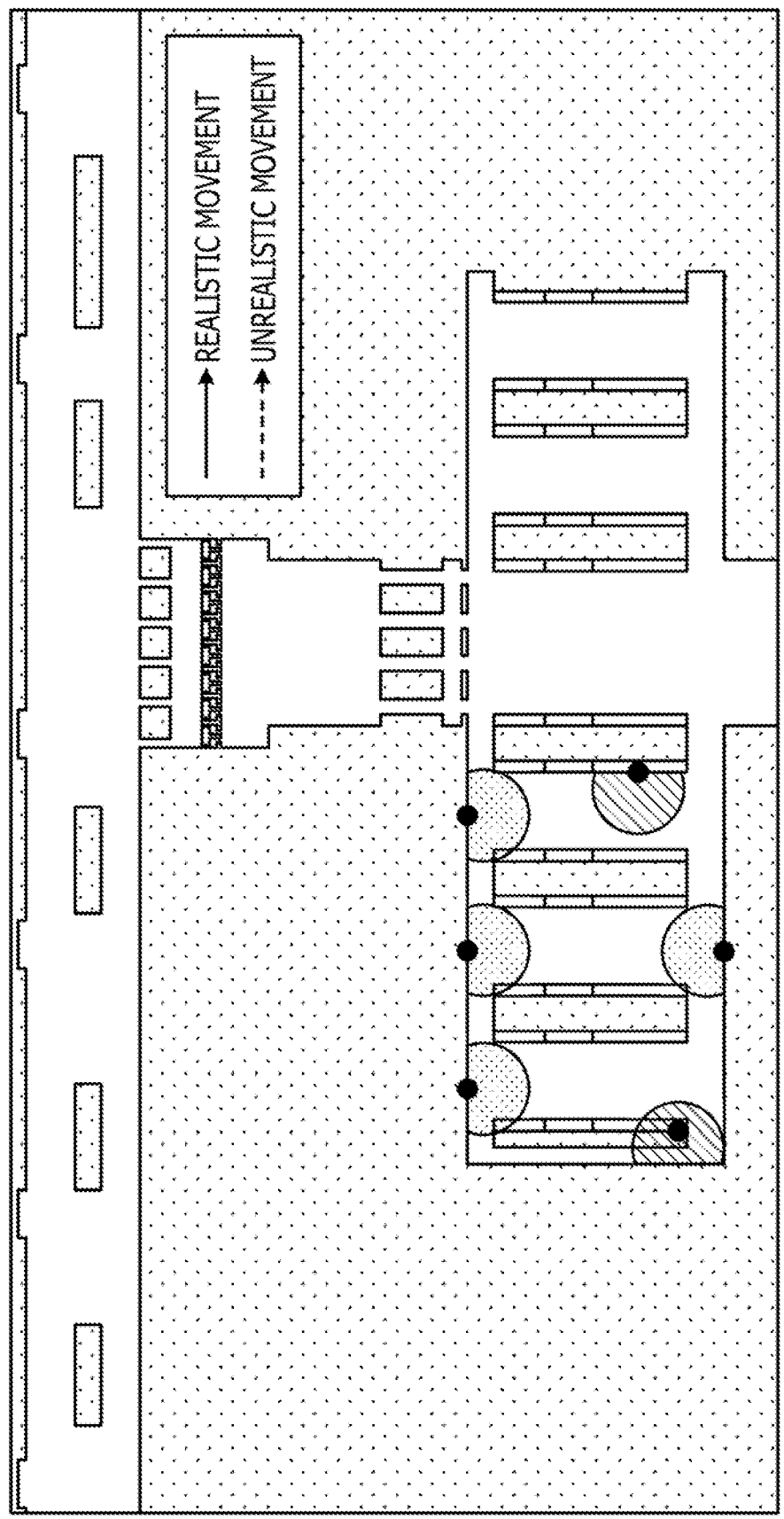

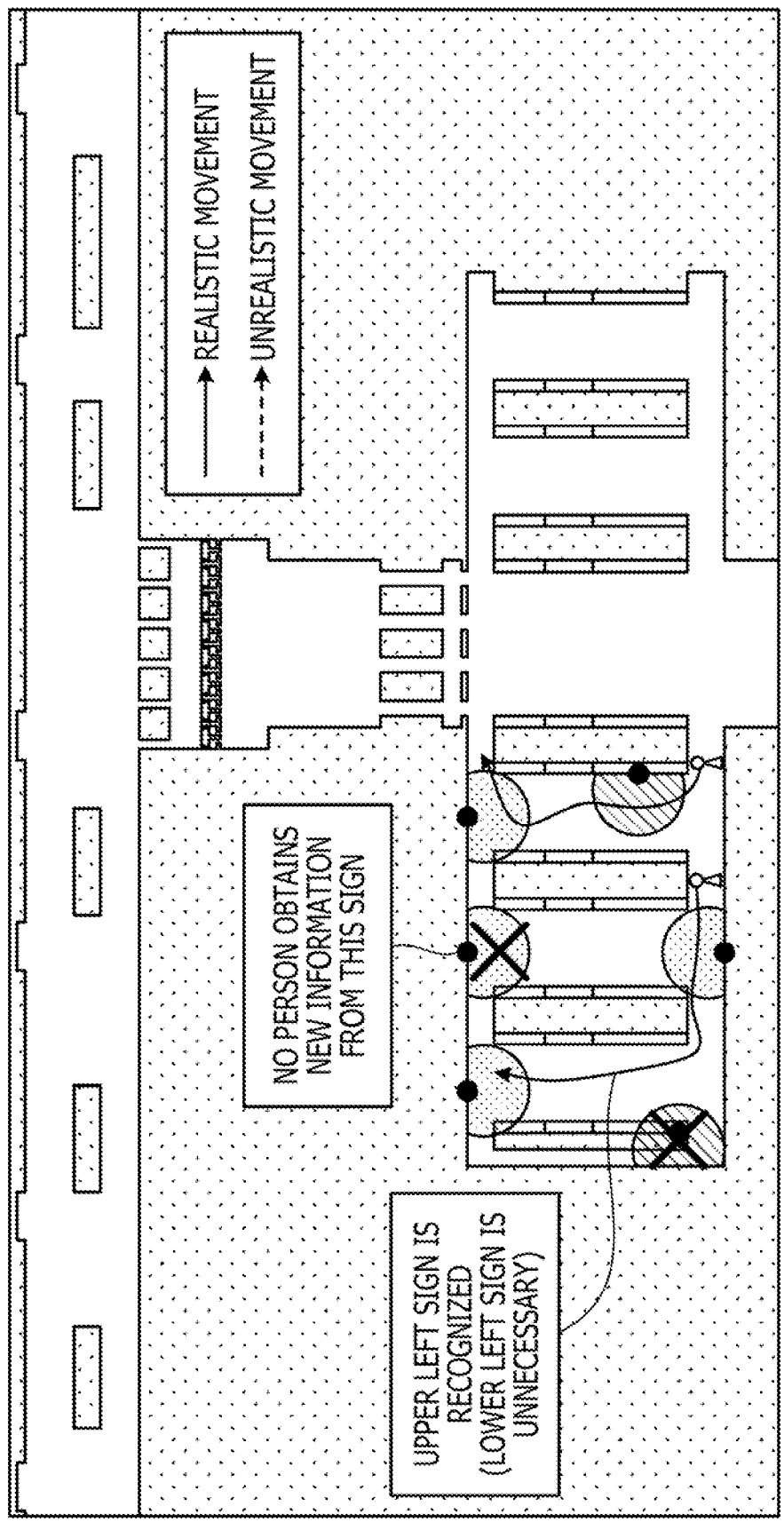

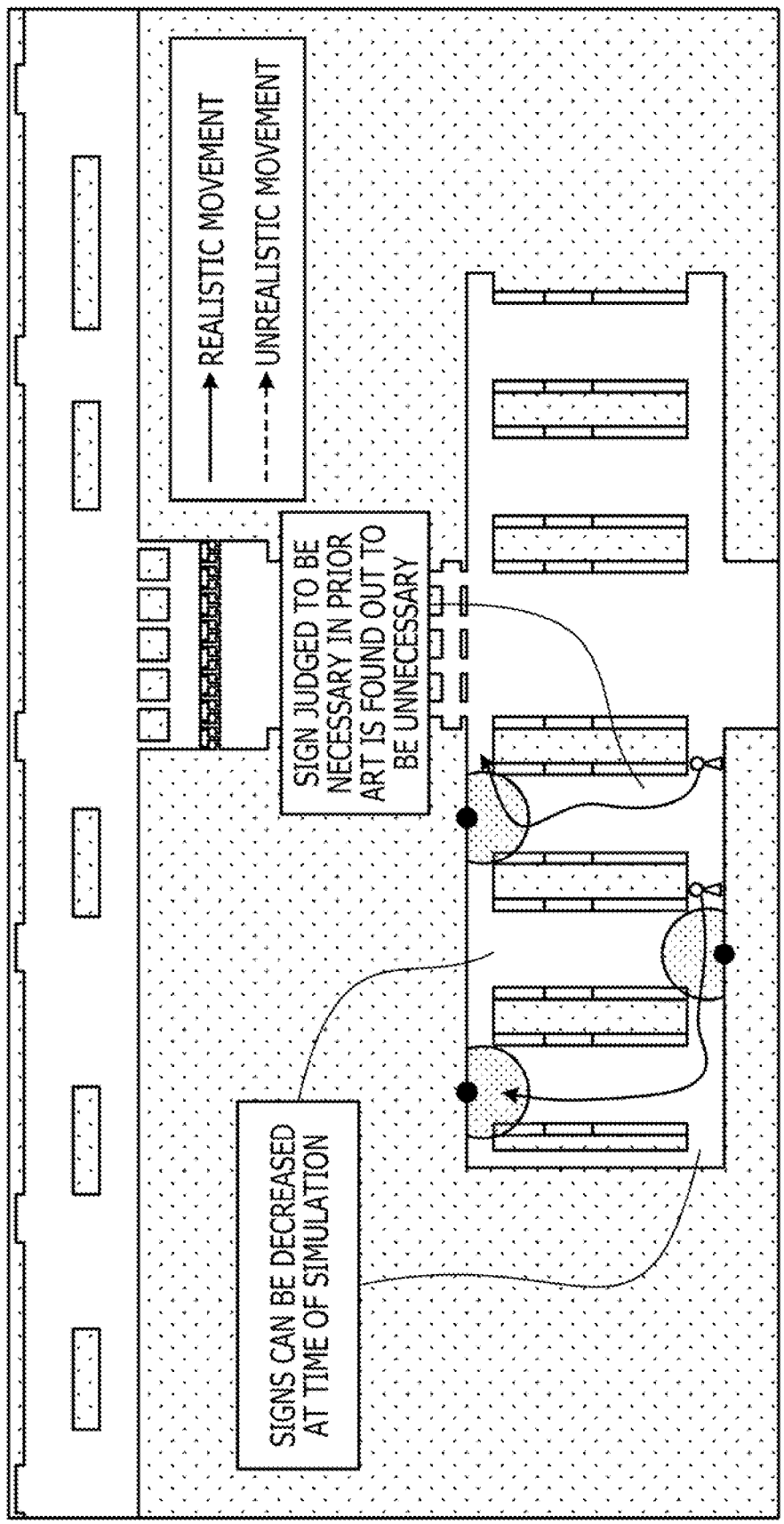

RECORDING MEDIUM RECORDING SIMULATION PROGRAM, SIMULATION METHOD, AND INFORMATION PROCESSING DEVICE FOR PEOPLE FLOW IN SIGN SYSTEM

CROSS-REFERENCE TO RELATED APPLICATION

This application is a continuation application of International Application PCT/JP2018/008163 filed on Mar. 2, 2018 and designated the U.S., the entire contents of which are incorporated herein by reference. The International Application PCT/JP2018/008163 is based upon and claims the benefit of priority of the prior Japanese Patent Application No. 2017-076313, filed on Apr. 6, 2017, the entire contents of which are incorporated herein by reference.

FIELD

Embodiments relate to a simulation program, a simulation method and a simulation device.

BACKGROUND

A people flow simulation has been utilized in a shopping mall, an airport, and the like, to examine a sign system plan for arrangement of notice boards (signs) that present various types of guidance, guides, and the like (hereinafter sometimes referred to collectively as signs).

Related art is disclosed in International Publication Pamphlet No. WO 2017/029698, Japanese Laid-open Patent Publication No. 2005-50117, and Japanese Laid-open Patent Publication No, 2009-181187.

SUMMARY

According to an aspect of the embodiments, a non-transitory computer-readable recording medium records a simulation program for causing a computer to execute a process including: arranging an agent, which has cognitive information and behaves in a virtual space based on the cognitive information, in the virtual space in which a plurality of guidance displays is set; when, with respect to each of the plurality of guidance displays, the agent enters within a first range of the respective guidance displays, and first guidance information corresponding to the first range is related with a destination of the agent, changing cognitive information up to the destination of the agent; and when, with respect to each of the plurality of guidance displays, the agent enters within a second range different from the first range, and second guidance information corresponding to the second range is related with the destination of the agent, changing cognitive information which is not directly related with the destination of the agent.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 is an explanatory diagram for explaining space information.

FIG. 3 is an explanatory diagram for explaining a sign system plan.

FIG. 5 is an explanatory diagram for explaining pedestrian information.

FIGS. 13A and 13B are an explanatory diagram for explaining the update of the cognitive information on the pedestrian agent in mode 1.

FIG. 16 is an explanatory diagram for explaining an example of the update of the cognitive information on the pedestrian agent in mode 2.

FIG. 22 is an explanatory diagram for explaining a sign system plan according to the modification.

FIG. 23 is an explanatory diagram for explaining pedestrian information according to the modification.

FIG. 25 is an explanatory diagram for explaining the update of the cognitive information on the pedestrian agent in mode 1 according to the modification.

FIG. 27 is an explanatory diagram for explaining the update of the cognitive information on the pedestrian agent in mode 2 according to the modification.

FIG. 28B is a diagram for explaining the advantage of the simulation device according to the embodiment.

FIG. 28D is a diagram for explaining the advantage of the simulation device according to the embodiment.

FIG. 29D is a diagram for explaining the advantage of the simulation device according to the embodiment.

DESCRIPTION OF EMBODIMENTS

For example, in a people flow simulation, a sign in accordance with a sign system plan and a pedestrian agent imitating a pedestrian are arranged in a virtual space corresponding to a shopping mall, an airport, or the like. Then, the flow of the pedestrian in the sign system plan is replicated by simulating the behavior of the pedestrian agent based on information acquired (cognized) from a sign arranged in the virtual space.

However, the accuracy of the simulation result may be degraded in some cases depending on the arrangement position of the sign and the like.

In one aspect, a simulation program, a simulation method, and a simulation device capable of implementing a people flow simulation with less fluctuations in accuracy may be provided.

Figure 31:
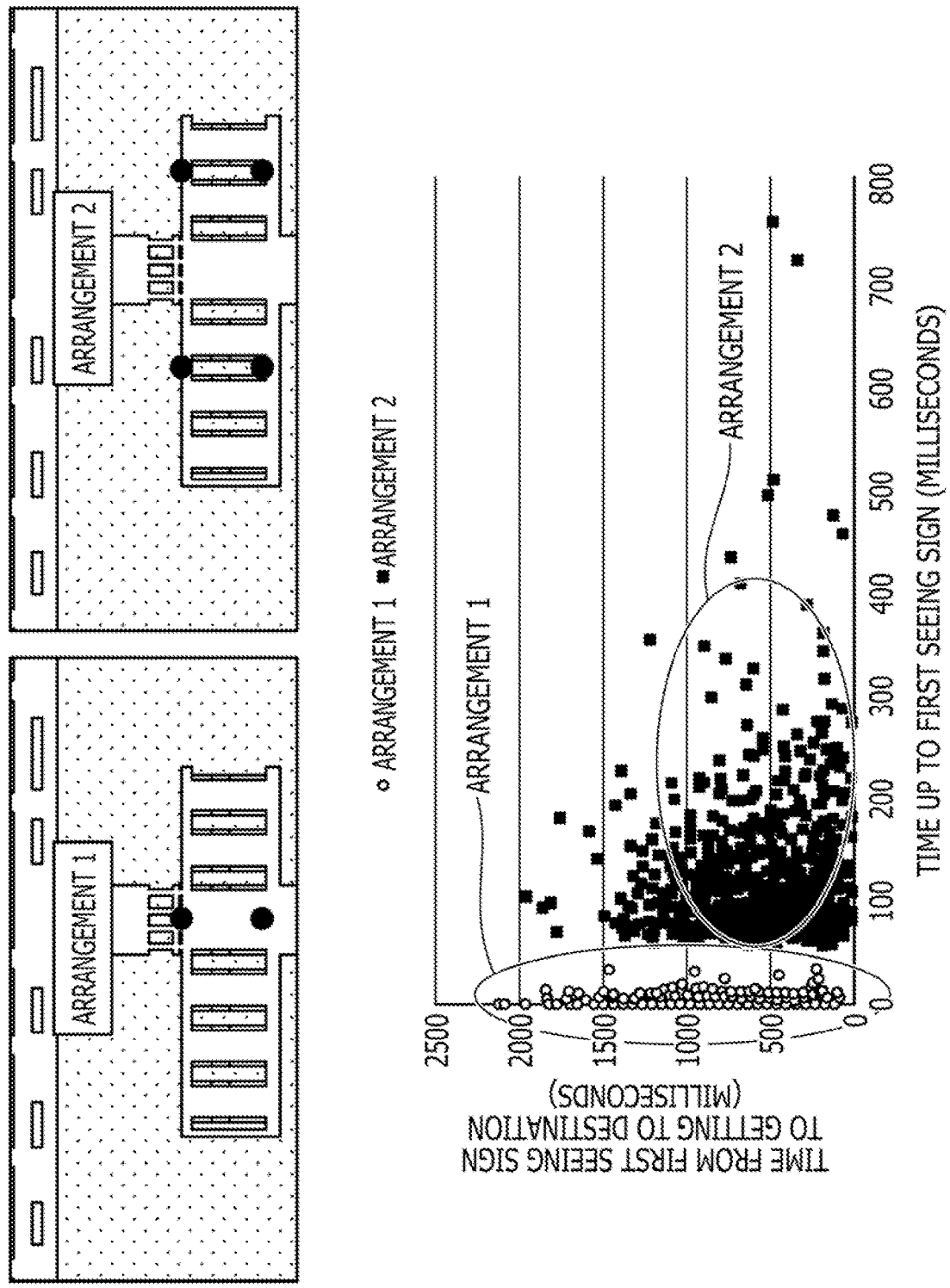
FIG. 31 is a diagram for explaining an example of sign arrangements and simulation results using the sign arrangements.
Figure 32:
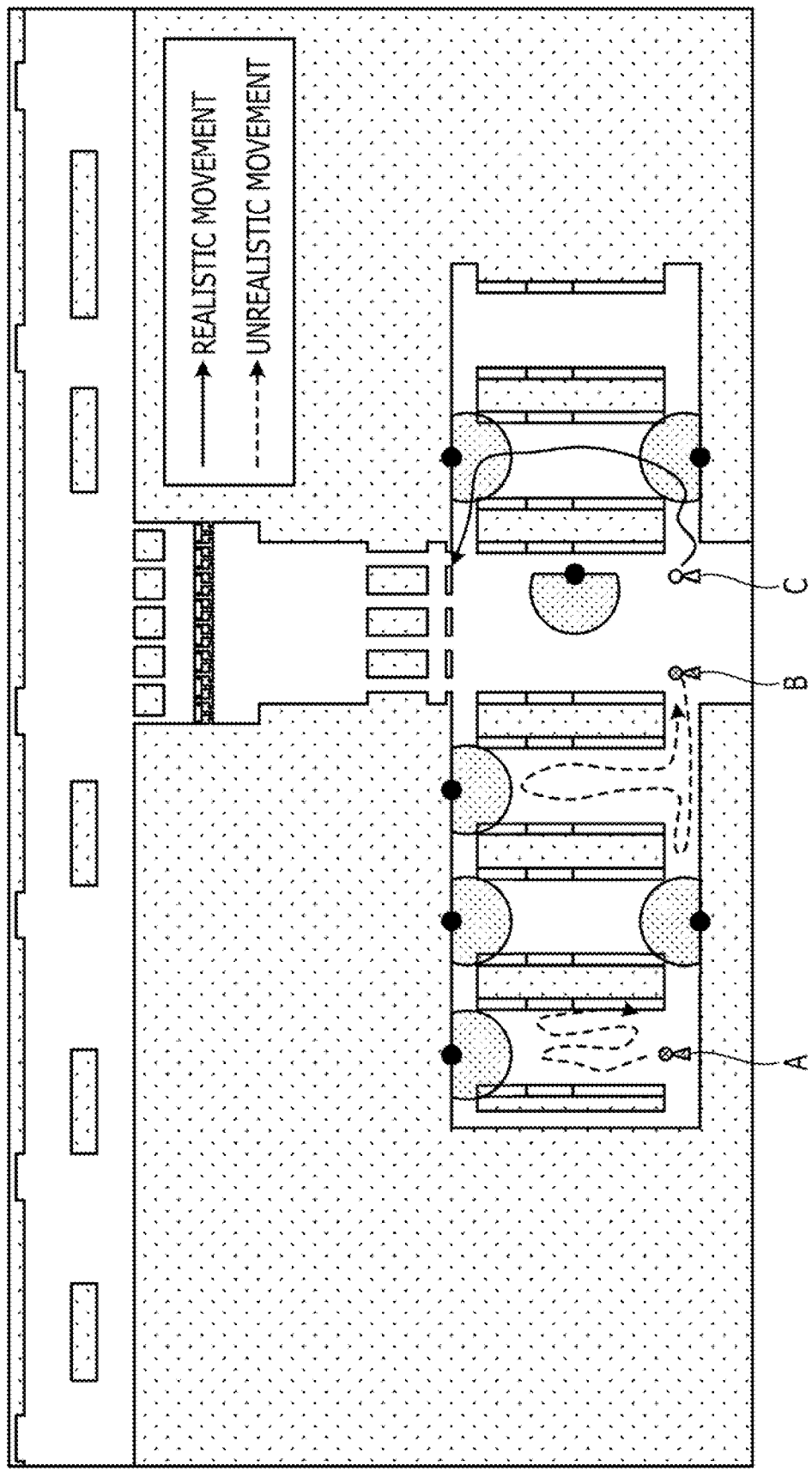
FIG. 32 is a diagram for explaining a case where a simulation model deviates from the reality.

Before describing a simulation program, a simulation method, and a simulation device according to embodiments, a case where a simulation model deviates from the reality and a case where the accuracy of a simulation result becomes unstable will be described, FIG. 31 is a diagram for explaining an example of sign arrangements and simulation results using the sign arrangements. FIG. 32 is a diagram for explaining a case where a simulation model deviates from the reality. In the examples in FIGS. 31 and 32, simulations are performed under the following conditions on assumption. Note that the sign means a guidance display. For example, a sign is an object that transmits predetermined information (guidance information) to a pedestrian agent.

(1) A destination is set in advance for the pedestrian agent.

(2) The pedestrian agent performs random walk until cognizing the direction of the destination with a sign.

(3) Once the pedestrian agent cognizes the direction of the destination with the sign, the pedestrian agent stops the random walk and starts moving toward the purpose.

(4) The pedestrian agent cognizes the display contents of the sign when the pedestrian agent comes within a predetermined distance range from the sign.

(5) The pedestrian agent fails to remember the display contents of the sign when a predetermined time elapses since the pedestrian agent cognized the sign.

First, the example in FIG. 31 will be described. The upper part of FIG. 31 illustrates a schematic diagram of a virtual space in which a pedestrian agent behaves. In FIG. 31, the dotted sections indicate places where structures such as stores and counters are arranged. In addition, white sections indicate passages along which the pedestrian agent moves. Furthermore, black circles indicate signs that provide the pedestrian agent with information on a store or the like. Additionally, the appearance point of the pedestrian agent is assumed as the end of a lower passage in FIG. 31.

In arrangement 1 illustrated in FIG. 31, two signs are arranged on a central passage. On the other hand, in arrangement 2, four signs are arranged at positions separated from the central passage.

The graph in the lower part of FIG. 31 represents data obtained by actually performing simulations based on arrangements 1 and 2. In the case of arrangement 1, the pedestrian agent cognizes the sign immediately after appearing in the virtual space. Therefore, the time up to first seeing the sign is short. However, there is a wide variation in the time from first seeing the sign to getting to the destination. On the other hand, in the case of arrangement 2, there is a wide variation in the time from the appearance of the pedestrian agent in the virtual space to the cognition of the first sign. The time from first seeing the sign to getting to the destination also varies widely.

When humans actually behave, a difference as large as a difference indicated by the graph in FIG. 31 is not produced between arrangements 1 and 2. However, in the simulation results, a large difference is produced between arrangements 1 and 2. A conceivable reason for the difference is that a precondition that the pedestrian agent does not recognize the sign unless the pedestrian agent enters within a predetermined range from the sign has been set in the simulations. Even if being far from the sign, the actual human being cognizes the presence of an object looking like a sign and goes toward the sign to confirm. In addition, the actual human being predicts what the sign is displaying, from the outline such as the appearance and color of the sign, and decides whether or not to confirm the sign. However, in the simulations in FIG. 31, a condition has been set such that the pedestrian agent cognizes the sign when entering within a predetermined distance from the sign, and does not cognize the sign if not entering within the predetermined distance. For this reason, it is considered that the time of the random walk in which the pedestrian agent keeps moving to look for the sign in the simulation is longer than the case of the actual human movement. Therefore, the large difference is brought about between the simulation results of arrangements 1 and 2.

Next, the example in FIG. 32 will be described. In FIG. 32, a pedestrian agent A does not enter predetermined distance ranges indicated by almost semicircles in FIG. 32 even if a sign is present ahead in a moving direction, and repeats turning in opposite directions. Although there is a sign ahead in the moving direction, a pedestrian agent B does not enter within the predetermined distance range even if the pedestrian agent B comes close to the predetermined distance range. In the case of an actual human being, it is considered normal to come nearer to a sign, thinking that information can be supplied from the sign when coming close to the sign. Accordingly, the behavior of the pedestrian agents A and B obtained by simulation are not realistic. On the other hand, a pedestrian agent C on the right side of FIG. 32 has reached the predetermined distance range from the sign and moved. As described above, when the simulation is performed under the conditions as mentioned above, the simulation model deviates from a realistic human behavior pattern in some cases.

First Embodiment

Hereinafter, a simulation program, a simulation method, and a simulation device according to embodiments will be described with reference to the drawings. The configurations with the same functions in the embodiments are denoted by the same reference signs, and the redundant description will be omitted. Note that the simulation program, the simulation method, and the simulation device to be described in the following embodiments are merely an example, and thus the embodiments are not limited thereto. In addition, each embodiment below may be appropriately combined within the scope of no contradiction.

In the first embodiment, deviation of the simulation model from the reality and fluctuations in the simulation result are suppressed. For this purpose, the first embodiment is configured taking the following points into account.

(1) The form of sign cognition by the pedestrian agent is set to a plurality of levels according to the distance from the sign.

(2) The behavior of the pedestrian agent is changed according to the display form of the sign.

As illustrated in the example in FIG. 32, if the pedestrian agent is assumed not to cognize the sign unless the pedestrian agent enters within a predetermined distance range from the sign, the pedestrian agent does not match the behavior form of an actual person. In reality, the behavior of a human being is decided also using, as judgment materials, vague information that is not clearly perceived by the human being. Accordingly, it is considered that the accuracy of the simulation can be stabilized if vague information that affects the behavior of the human being can be reflected in the simulation. Thus, in the present embodiment, the form of sign cognition is set to a plurality of levels. First, a level at which the pedestrian agent grasps the correct information contents displayed by the sign (first mode) is set. Second, a level at which the pedestrian agent cannot grasp the correct information contents of the sign, but can obtain judgment materials about the presence of the sign and the display contents (second mode) is set.

Figure 33A:
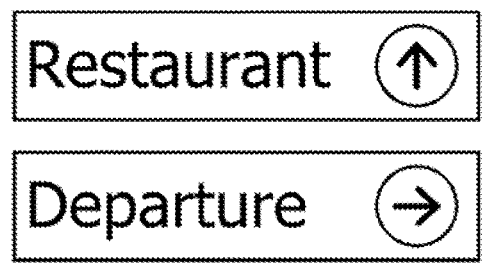
FIG. 33A is a diagram for explaining arrow type signs.
Figure 33B:
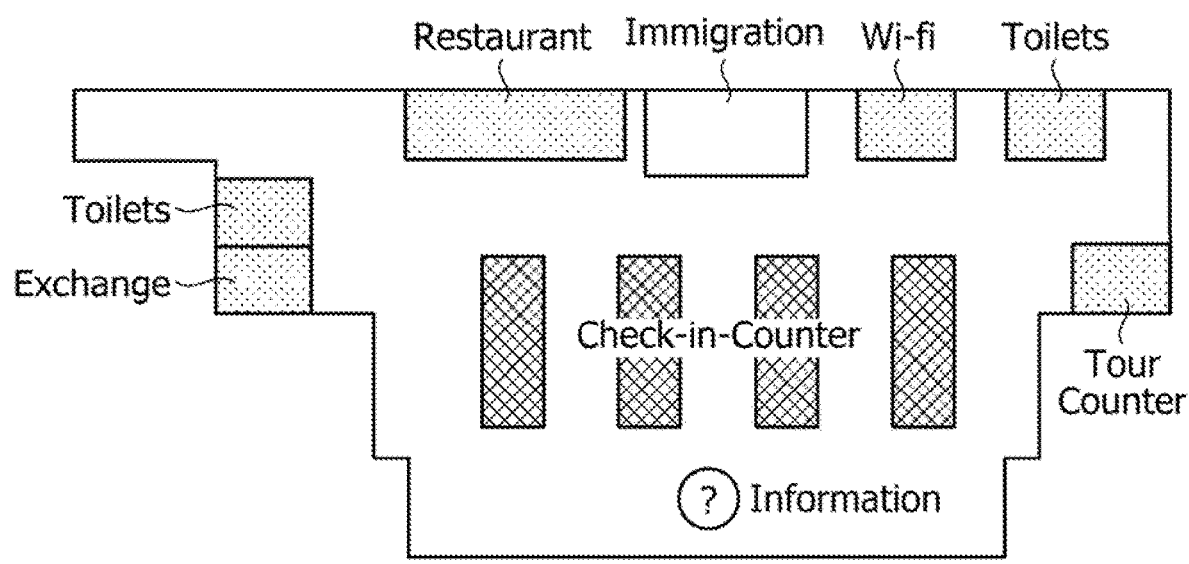
FIG. 33B is a diagram for explaining a map type sign.

Moreover, in the present embodiment, the differences as follow are assumed in the display form of the sign. FIGS. 33A and 33B are diagrams for explaining the differences in the display form of the sign. FIG. 33A is a diagram for explaining arrow type signs. The arrow type is a classification of sign that indicates a place where the destination is present, by an arrow. FIG. 33B is a diagram for explaining a map type sign. The map type is a classification of sign that displays destinations such as a plurality of stores collectively on a map. The arrow type can be said to be a sign that displays the rough position of a particular destination. In contrast, the map type can be said to be a sign that displays the exact positions of a plurality of destinations. It is considered that the pedestrian agent can perceive the difference in the sign display form, such as the difference between the arrow type and the map type, even from a distance. Additionally, the pedestrian agent is expected to take different behaviors between the case of the arrow type and the case of the map type. For this reason, in the present embodiment, in addition to distinguishing the cognition forms of the pedestrian agent into a plurality of levels, the behavior changes of the pedestrian agent are distinguished according to the display form of the sign. Note that, although the arrow type and the map type will be described hereafter as an example of the classification of the display forms of the sign, the classification of the display forms is not limited to this example. For example, it is also possible to set simulation conditions so as to change the behavior of the pedestrian agent according to the display forms such as the size of the sign, and the color and shape of the graphic and the dimensions of characters displayed on the sign. Furthermore, it is also possible to set simulation conditions in consideration of the legibility of the sign as the display forms, for example, whether the sign is illuminated by illumination light or whether there is a change in direction (such as a rotating sign).

Figure 1:
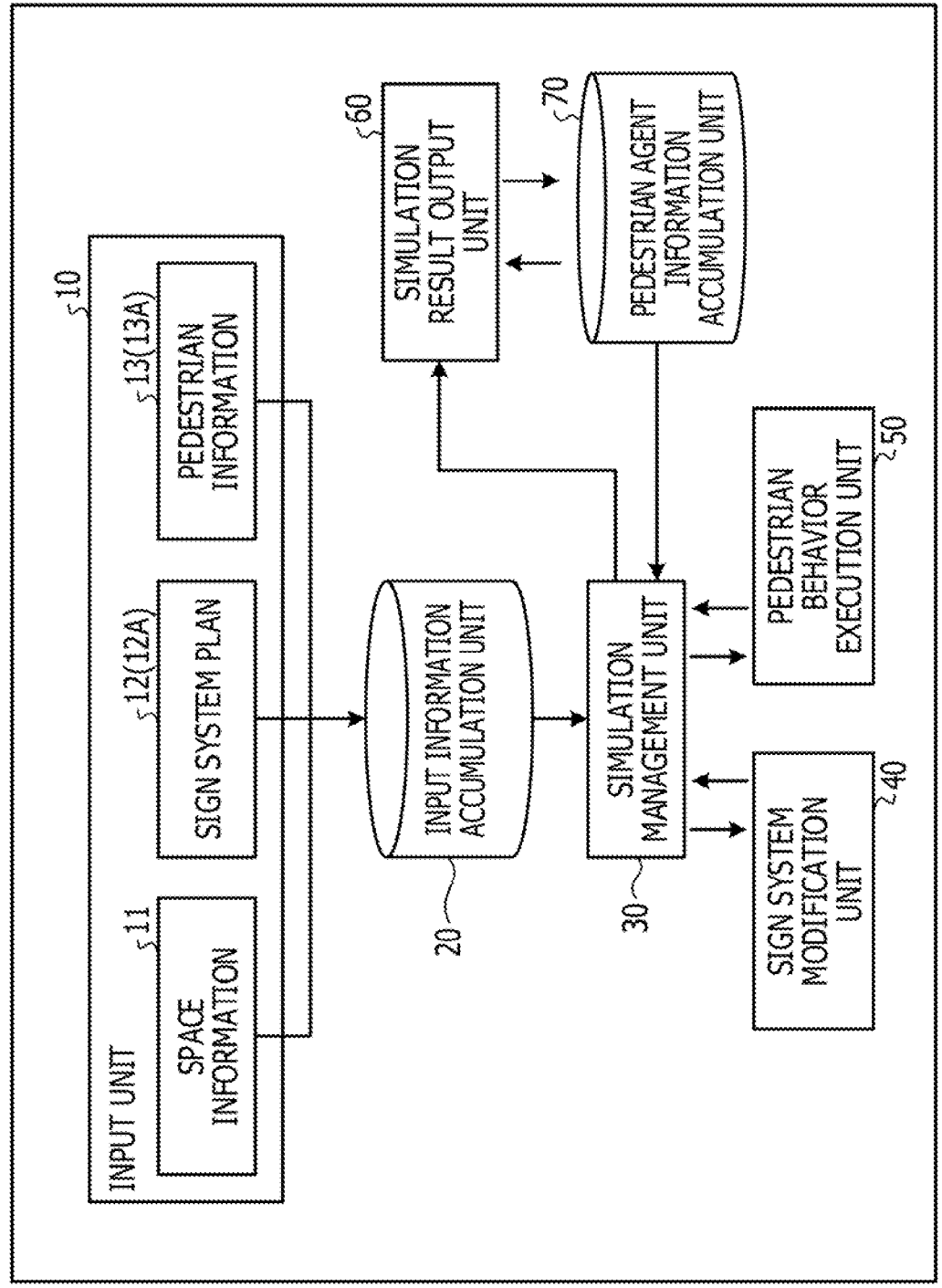
FIG. 1 is a block diagram depicting the configuration of a simulation device according to an embodiment.

FIG. 1 is a block diagram depicting the configuration of a simulation device 1 according to an embodiment. The simulation device 1 illustrated in FIG. 1 is an information processing device such as a personal computer (PC). The simulation device 1 simulates the behavior of a pedestrian agent (hereinafter sometimes simply referred to as "agent") in a virtual space based on input information, and carries out a people flow simulation for imitating the flow of a pedestrian. As illustrated in FIG. 1, the simulation device 1 includes an input unit 10, an input information accumulation unit 20, and a simulation management unit 30. The simulation device 1 further includes a sign system modification unit 40, a pedestrian behavior execution unit 50, a simulation result output unit 60, and a pedestrian agent information accumulation unit 70.

The input unit 10 receives input information concerning simulation, such as space information 11, a sign system plan 12, and pedestrian information 13, from an input device such as a mouse or a keyboard.

The input information accumulation unit 20 accumulates the input information input from the input unit 10, such as the space information 11, the sign system plan 12, and the pedestrian information 13, in a storage device such as a random access memory (RAM) or a hard disk drive (HDD).

The space information 11 is information indicating the structure of a virtual space concerning simulation, such as a shopping mall or an airport. Specifically, in the space information 11, a cell environment is described for a virtual space (e.g., the area, the number of floors, a wall, a passage, and the position of a facility) in which the pedestrian agent in simulation travels. The space information 11 also describes a network environment for connection between nodes (e.g., passages and facilities) in the virtual space. A user inputs the space information 11 on a virtual space to be examined in simulation into the simulation device 1.

FIG. 2 is an explanatory diagram for explaining the space information 11. As illustrated in FIG. 2, the space information 11 describes the cell environment such as the area of the virtual space, the number of floors, a wall number indicating a cell (wall) to which the pedestrian agent cannot proceed, and the position of the wall. In addition, in the space information 11, a network environment such as the position (coordinates) of the node, the walking goal (Waypoint), and the classification of the node such as the facility (Facility) is described for each node number indicating the node. Furthermore, in the network environment, an edge number and node numbers indicating nodes connected to each other are described for each edge between nodes in which movements are allowed.

The sign system plan 12 is information indicating the arrangement and contents of signs presenting various types of guidance in a shopping mall, an airport, or the like. Specifically, in the sign system plan 12, attributes (the position, an information transmittable range, and a recognizable range) serving as characteristics of each sign are described. The sign system plan 12 also describes information (facility information and guidance intention) concerning what each sign passes to the pedestrian agent (causes the pedestrian agent to cognize). The user inputs the sign system plan 12 to be examined in simulation into the simulation device 1.

FIG. 3 is an explanatory diagram for explaining the sign system plan 12. As illustrated in FIG. 3, in the sign system plan 12, attributes (the position, the information transmittable range, and the recognizable range) serving as characteristics of each sign are described for each sign number that identifies the sign.

"Position" is the installation position of the sign in the virtual space. "Information transmittable range" indicates a range in which the sign can pass information to the pedestrian agent (can cause the pedestrian agent to cognize information). "Information transmittable range" is a range in which the pedestrian agent can cognize the specific contents of information displayed by the sign. "Information transmittable range" includes "distance" and "angle". "Distance" is a value indicating a distance in the virtual space within which the sign can pass information to the pedestrian agent. "Angle" is a value indicating an angle within which the sign can pass information to the pedestrian agent. "Recognizable range" indicates a range in which the pedestrian agent can recognize the sign. "Recognizable range" is a range in which the pedestrian agent can recognize, for example, the presence and the display form (e.g., color and shape) of the sign, but cannot cognize as far as the specific contents and details of information displayed by the sign. "Recognizable range" is, for example, a range in which the pedestrian agent can recognize whether the sign is of the map type or the arrow type. "Recognizable range" includes "distance" and "angle". "Distance" is a value indicating a distance in the virtual space within which the pedestrian agent can recognize the sign. "Angle" is a value indicating an angle within which the pedestrian agent can recognize the sign. In addition to these items, the sign system plan 12 may include a description of the time required for the pedestrian agent to cognize the contents indicated by the sign, or the like.

As for the attributes serving as characteristics of each sign in the sign system plan 12, a value evaluated depending on the size, the contents, and the like of each sign whose installation is planned is input. For example, in the case of a sign having a large notice board but a few amount of contents to be transmitted (for example, a sign whose contents can be easily read even from far), the distances and angles of the information transmittable range and the recognizable range are assigned as larger values. In addition, in the case of a sign having a notice board of the same size but a large amount of contents to be transmitted (for example, a sign whose contents are difficult to read from far), the distance and angle of the information transmittable range are assigned as smaller values.

Furthermore, in the sign system plan 12, information (facility information and guidance intention) concerning the cognition of the pedestrian agent is described for each sign number that identifies the sign.

"Facility information" is information about a facility to be passed to (made cognized by) the pedestrian agent and, for example, has a number indicating the facility. The facility information may include an area (e.g., a restaurant area, a currency exchange area, and an eating place area) arranged in the virtual space. "Guidance intention" is an intention to pass information to the pedestrian agent by the sign. In addition, "guidance intention" represents the display mode of the sign. For example, "guidance intention" is to transmit a rough arrangement of stores and the like in the virtual space to the pedestrian agent. In this case, "guidance intention" is "arrow type". Alternatively, for example, "guidance intention" is to transmit the exact position of a particular facility to the pedestrian agent. In this case, "guidance intention" is "map type". In addition to these items, the sign system plan 12 may include an indicator of the easiness for the pedestrian agent to forget information transmitted by each sign.

As for information concerning cognition of each sign in the sign system plan 12, a value evaluated depending on the contents and the like of each sign whose installation is planned is input. In addition, the facility information and the guidance intention include numerical values for calculation of the degree of coincidence (described later). The numerical values of the facility information and the guidance intention are adjusted in advance such that the degree of coincidence of information is appropriately expressed, and then input.

For example, in the example in FIG. 3, "position, (20, 80, 10)", "information transmittable range, distance, 10", and "information transmittable range, angle, $\frac{2}{3}\pi$" are described in association with the sign of "sign number, 1". In addition, "recognizable range, distance, 30" and "recognizable range, angle, $\frac{2}{3}\pi$" are described in association with "sign number, 1". Furthermore, "facility information, 0: area (restaurant)" and "guidance intention, 0: arrow type" are described in association with "sign number, 1". This description indicates that the sign identified by the sign number "1" is arranged at a position in the virtual space represented by the coordinates (20, 80, 10). This description also indicates that the pedestrian agent can cognize the specific contents of information displayed by the sign with the sign number "1" up to a distance of 10 meters from the sign. Moreover, this description indicates that the pedestrian agent can cognize the specific contents of information displayed by the sign with the sign number "1" within a range of angle $\frac{2}{3}\pi$ centered on the sign. Meanwhile, this description indicates that the pedestrian agent can cognize the display form of the sign with the sign number "1" up to a distance of 30 meters from the sign. This description also indicates that the pedestrian agent can cognize the display form of the sign with the sign number "1" within a range of angle $\frac{2}{3}\pi$ centered on the sign. This description also indicates that the sign with the sign number "1" displays an area represented by the numerical value "0", where restaurants are present. This description also indicates that the sign with the sign number "1" is of the arrow type represented by the numerical value "0", and has a display form for displaying a rough position.

Figure 4:
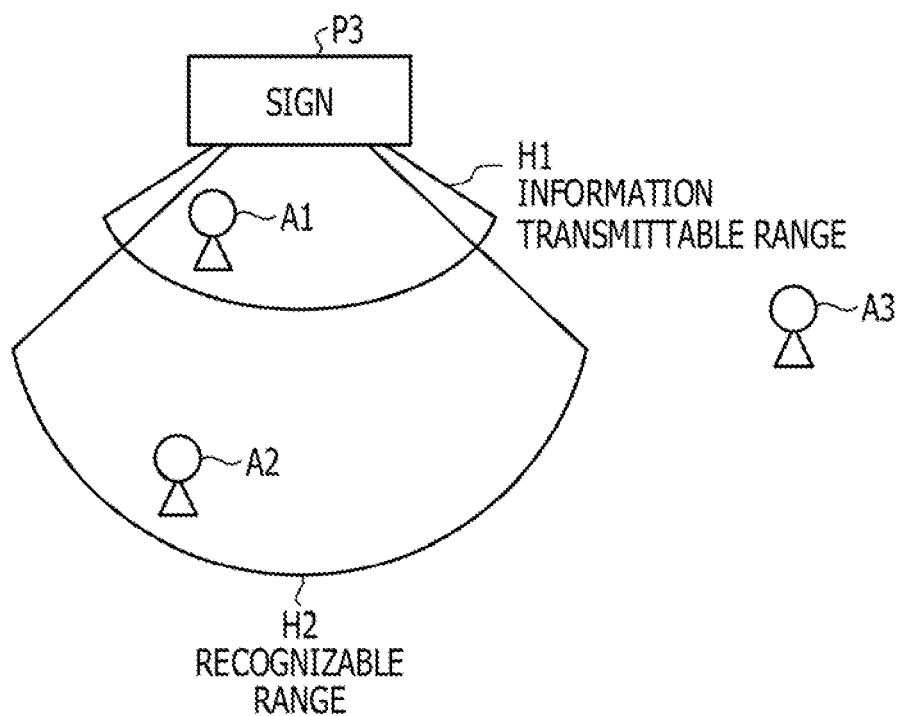
FIG. 4 is an explanatory diagram for explaining an information transmittable range and a recognizable range of guidance information by a sign.

FIG. 4 is an explanatory diagram for explaining the information transmittable range and the recognizable range of guidance information by a sign P3. As illustrated in FIG. 4, two ranges corresponding to the information transmittable range and the recognizable range in the sign system plan 12, namely, an information transmittable range H1 and a recognizable range H2 are set for the sign P3 arranged in a virtual space P. A pedestrian agent A1 located within the information transmittable range H1 can acquire (cognize) the specific contents of the guidance information from the sign P3. On the other hand, a pedestrian agent A2 located outside the information transmittable range H1 cannot acquire (cognize) the specific contents of the guidance information from the sign P3. However, since the pedestrian agent A2 is located outside the information transmittable range H1 but within the recognizable range H2, the pedestrian agent A2 can acquire (cognize) the presence and the display form (the map type or the arrow type) of the sign P3. Meanwhile, a pedestrian agent A3 located outside the information transmittable range H1 and the recognizable range H2 does not recognize even the presence of the sign P3.

Hereinafter, a process in a case where the pedestrian agent is present within the information transmittable range H1 of a sign and the sign is present within the recognition field of view of the pedestrian agent is also referred to as process in "mode 1". In addition, a process in a case where the pedestrian agent is present outside the information transmittable range H1 but within the recognizable range H2 of a sign and the sign is present within the recognition field of view of the pedestrian agent is also referred to as process in "mode 2".

Referring back to FIG. 1, the pedestrian information 13 is information indicating a pedestrian agent in the virtual space. Specifically, the pedestrian information 13 is information about the occurrence probability of the pedestrian agent occurring at an appearance point corresponding to an entrance or the like in the virtual space. In addition, the pedestrian information 13 is information about the classification (attribute) of the pedestrian agent to occur. Note that the classification of the pedestrian agent is assigned, for example, by gender such as male or female, or age group such as children (early children, elementary, junior high, and high school students), or adults (20 to 40 years, 40 to 60 years, and 60 years or older). The user inputs the pedestrian information 13 about a pedestrian to be examined in simulation into the simulation device 1.

FIG. 5 is an explanatory diagram for explaining the pedestrian information 13. As illustrated in FIG. 5, the pedestrian information 13 describes the occurrence probability of the pedestrian agent and the characteristics of the pedestrian agent to occur for each number indicating the classification of the pedestrian. The characteristics of the pedestrian agent include "occurrence ratio", "visual recognition distance", "viewing angle", "destination", and the like.

"Occurrence ratio" indicates the ratio of occurrence of each pedestrian agent. "Visual recognition distance" and "viewing angle" indicate the distance and angle within which each pedestrian agent is capable of visual recognition in the virtual space. "Destination" is a value indicating the destination of each pedestrian agent (e.g., a restaurant or a shopping place).

As for the contents of the pedestrian information 13, a value assuming a pedestrian who visits the virtual space concerning simulation, such as a shopping mall or an airport, is input. For example, when the use by adults (20 to 40 years and 40 to 60 years) is high but the use by children (early children, elementary, junior high, and high school students) is low, the occurrence ratios of pedestrian classifications corresponding to adults are raised. In addition, the occurrence ratios of pedestrian classifications corresponding to children are set smaller.

For example, in the example in FIG. 5, "pedestrian classification, 1", "occurrence ratio, 0.1", "visual recognition distance, 100", "viewing angle, $2\pi$", "destination, 0: area (restaurant)" are stored. This indicates that a pedestrian agent of the pedestrian classification "1" (for example, an adult male) occurs at a ratio of 0.1. This also indicates that the pedestrian agent of the pedestrian classification "1" cognizes an object within the range of field of view, with a range with a radius of 100 meters and a viewing angle of $2\pi$ as the range of field of view. In addition, this indicates that the pedestrian agent of the pedestrian classification "1" moves for an area where restaurants are present, as a destination.

Note that, although not illustrated in FIG. 5, the pedestrian information 13 may include other information for each pedestrian agent, such as the speed at the time of random walk and the speed when the destination is set.

Referring back to FIG. 1, the simulation management unit 30 manages the process of simulating the behavior of the pedestrian agent in the virtual space based on the input information accumulated in the input information accumulation unit 20 (the space information 11, the sign system plan 12, and the pedestrian information 13). The simulation of the behavior of the pedestrian agent in the virtual space is performed in the pedestrian behavior execution unit 50. Specifically, the simulation management unit 30 reads the input information accumulated in the input information accumulation unit 20 and outputs the read input information to the pedestrian behavior execution unit 50. The simulation management unit 30 also reads the results of sequentially simulating the behavior of the pedestrian agent, which have been accumulated in the pedestrian agent information accumulation unit 70. Then, the simulation management unit 30 outputs the read simulation results to the pedestrian behavior execution unit 50. The simulation results to be output include, for example, the position information on the pedestrian agent and the cognitive information on the pedestrian agent.

In addition, the simulation management unit 30 outputs the results obtained by the pedestrian behavior execution unit 50 sequentially simulating the behavior of the pedestrian agent (the position information on the pedestrian agent and the cognitive information on the pedestrian agent) to the simulation result output unit 60.

Furthermore, the simulation management unit 30 updates the position information and the cognitive information on the pedestrian agent accumulated in the pedestrian agent information accumulation unit 70 according to the simulation results by the pedestrian behavior execution unit 50.

The sign system modification unit 40 modifies the sign system plan 12 accumulated in the input information accumulation unit 20 depending on an operation instruction received from the user on an input device such as a mouse or a keyboard. This allows the user to modify the sign system plan 12 as appropriate.

The pedestrian behavior execution unit 50 sequentially simulates the behavior of the pedestrian agent with the input information (the space information 11, the sign system plan 12, and the pedestrian information 13) as an initial condition. Specifically, depending on the results of simulating the behavior of the pedestrian agent up to the preceding time (the position information and cognitive information on the pedestrian agent), the pedestrian behavior execution unit 50 simulates the behavior of the pedestrian agent at the following time. The pedestrian behavior execution unit 50 outputs the results of sequential simulations to the simulation management unit 30.

The simulation result output unit 60 accumulates the results of sequentially simulating the behavior of the pedestrian agent (the position information and the cognitive information on the pedestrian agent) in the pedestrian agent information accumulation unit 70. In addition, the simulation result output unit 60 outputs the simulation results accumulated in the pedestrian agent information accumulation unit 70 by a display on a display device or printing on a printing device. In the output of the simulation results mentioned above, the results of sequential simulations may be sequentially output. Furthermore, the total result of the results of simulations over a predetermined time may be output.

The pedestrian agent information accumulation unit 70 accumulates simulation results such as information on the pedestrian agent (the position information and the cognitive information), which is the results of sequential simulations, in a storage device such as a random access memory (RAM) or a hard disk drive (HDD).

Figure 6:
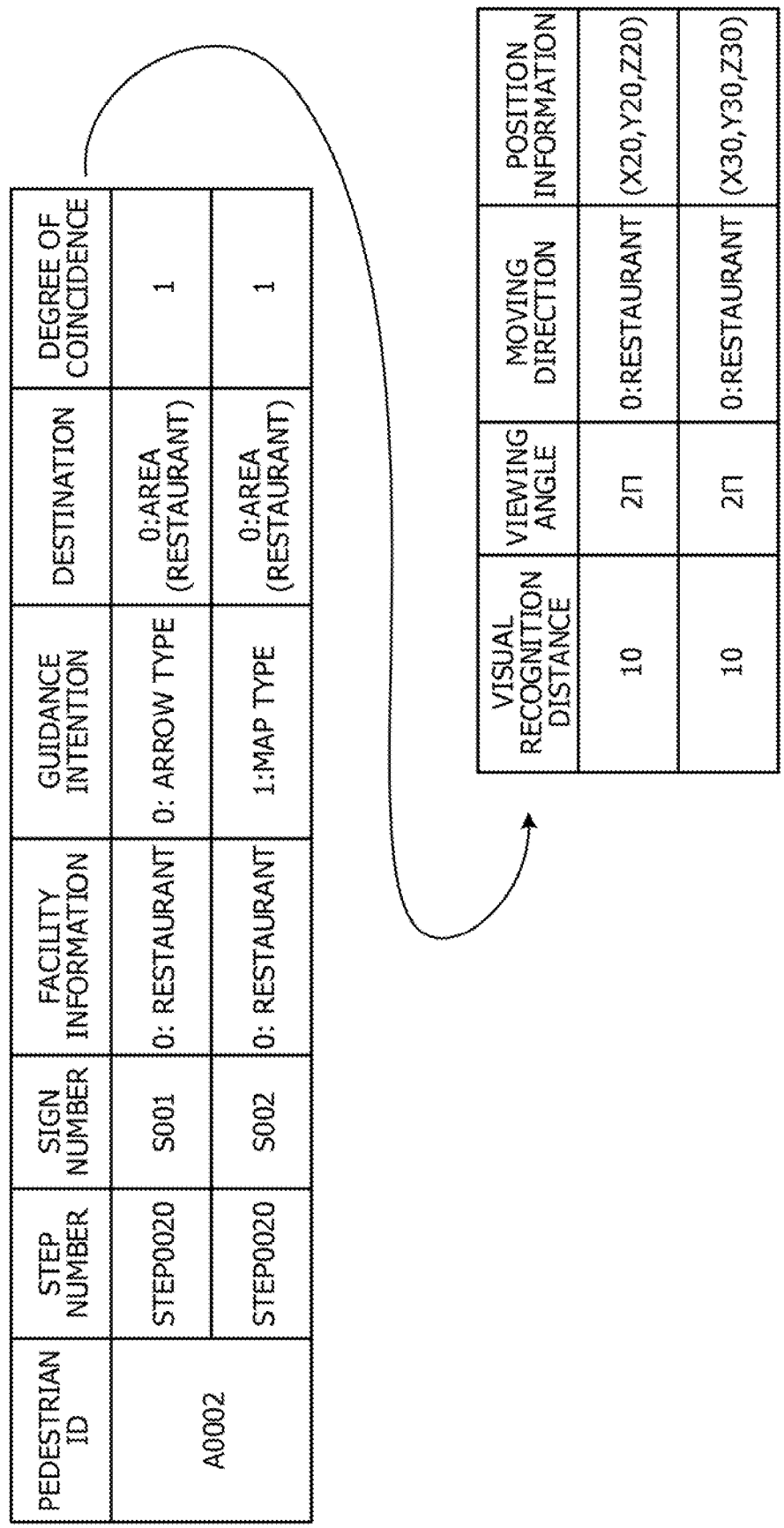
FIG. 6 is an explanatory diagram for explaining position information and cognitive information.

FIG. 6 is an explanatory diagram for explaining the position information and the cognitive information. The position information and the cognitive information are accumulated in the pedestrian agent information accumulation unit 70. The position information indicates the existing position of each pedestrian agent at each time point in simulation. The position information displays, for example, the existing position of each pedestrian agent in the virtual space using coordinates as in the space information 11. New position information is accumulated in the pedestrian agent information accumulation unit 70 for each pedestrian agent at every simulation step (indicating a predetermined time point) by the pedestrian behavior execution unit 50.

The cognitive information indicates the cognitive state of each pedestrian agent at each simulation step. Upon generating a pedestrian agent, the simulation management unit 30 allocates identification information such as identification data (ID) to each pedestrian agent, and accumulates the cognitive information in the pedestrian agent information accumulation unit 70. The cognitive information is accumulated in association with the position information. The cognitive information is updated and accumulated in the pedestrian agent information accumulation unit 70 through processes by the simulation management unit 30. For example, the pedestrian behavior execution unit 50 executes a simulation to change the position of the pedestrian agent. The pedestrian behavior execution unit 50 passes the position information on the pedestrian agent after the change to the simulation management unit 30. The simulation management unit 30 accumulates the position information after the change in the pedestrian agent information accumulation unit 70. The simulation management unit 30 executes an update process for the cognitive information based on the position information after simulation. The pedestrian behavior execution unit 50 performs simulation based on the updated cognitive information and passes the position information on the pedestrian agent at the time of the following simulation step to the simulation management unit 30. The cognitive information is sequentially updated in this manner, and both of the cognitive information before updating and the cognitive information after updating are stored.

In the example in FIG. 6, the cognitive information includes "pedestrian ID", "step number", "sign number", "facility information", "guidance intention", "destination", "degree of coincidence", "visual recognition distance", "viewing angle", and "moving direction". In addition, the position information is associated with the cognitive information.

"Pedestrian ID" is given to the pedestrian agent each time a pedestrian agent is generated in the simulation. "Pedestrian ID" is an identifier for uniquely identifying each pedestrian agent. "Step number" indicates a predetermined time point set in the simulation. In the example in FIG. 6, the step number rises as the simulation time elapses. "Sign number" represents a sign number of a sign cognized by the pedestrian agent at the time point of the corresponding step number (see FIG. 3). "Facility information" represents facility information on the sign cognized by the pedestrian agent at this time point (see FIG. 3). "Guidance intention" represents guidance intention of the sign cognized by the pedestrian agent at this time point (see FIG. 3). "Destination" represents the destination of the pedestrian agent (see FIG. 5). "Degree of coincidence" indicates the degree of coincidence between corresponding "facility information" and "destination". "Degree of coincidence" also indicates the degree of coincidence between corresponding "guidance intention" and "destination", "Visual recognition distance" represents a visual recognition distance of the pedestrian agent set based on the degree of coincidence between "guidance intention" and "destination". "Viewing angle" represents the viewing angle of the pedestrian agent set based on the degree of coincidence between "guidance intention" and "destination". "Moving direction" represents the moving direction of the pedestrian agent set based on the degree of coincidence between "guidance intention" or "facility information" and "destination". The update process for the cognitive information and the technique of calculating the degree of coincidence will be further described later. Note that, in the example in FIG. 6, "pedestrian ID" and "step number" are displayed as a part of the cognitive information. However, as the actual configuration of the device, since one piece of information is stored and updated as needed for each pedestrian agent as the cognitive information, the portion excluding "pedestrian ID" and "step number" may be called the cognitive information.

Figure 7:
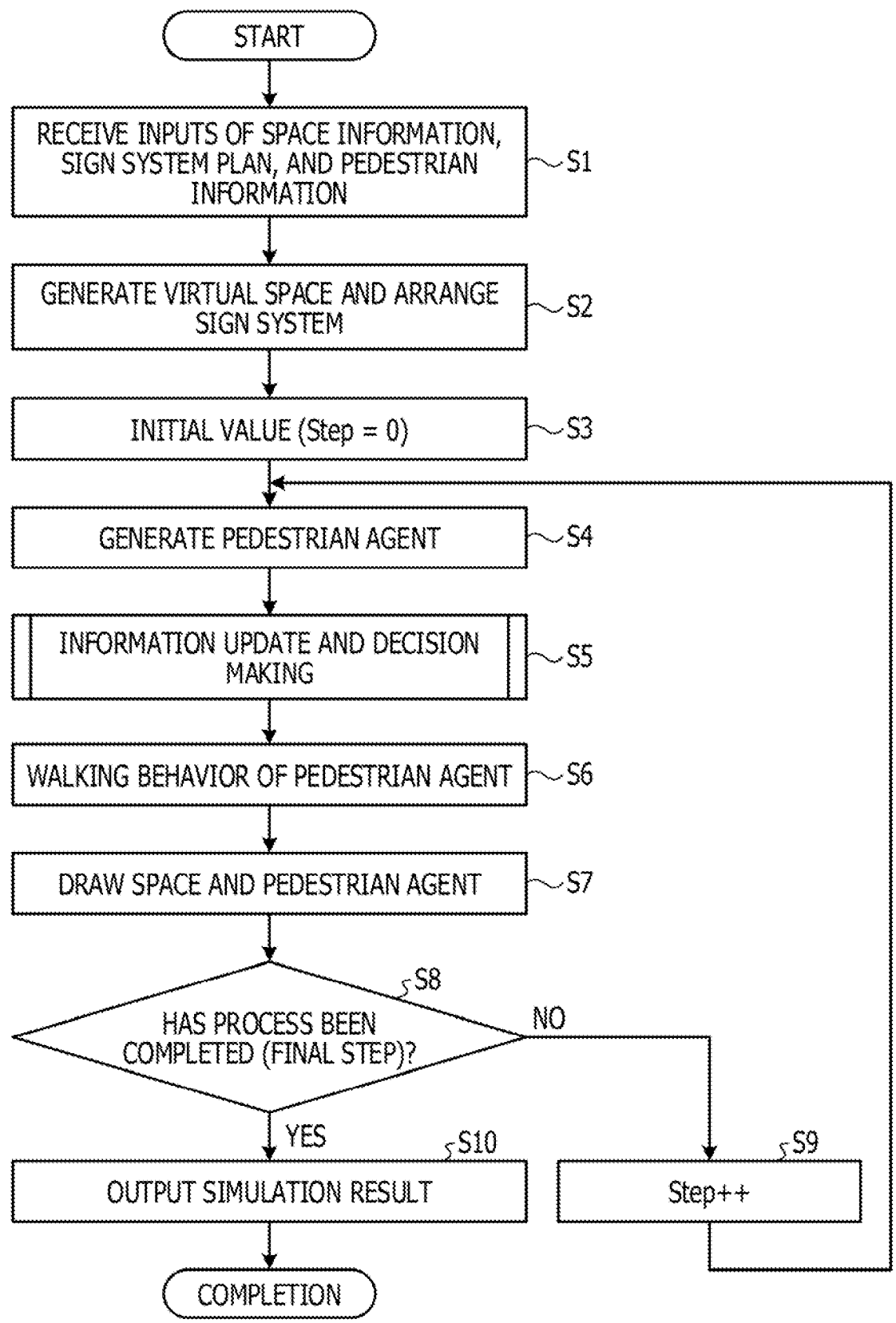
FIG. 7 is a flowchart illustrating an action example of the simulation device.

Next, the details of the action of the simulation device 1 will be described. FIG. 7 is a flowchart illustrating an action example of the simulation device 1.

As illustrated in FIG. 7, once the process is started, the input unit 10 receives inputs of the space information 11, the sign system plan 12, and the pedestrian information 13 and accumulates the received inputs in the input information accumulation unit 20 (S1). Subsequently, the simulation management unit 30 generates a virtual space and arranges a sign system in the virtual space depending on the input space information 11 and sign system plan 12 (S2).

Figure 8:
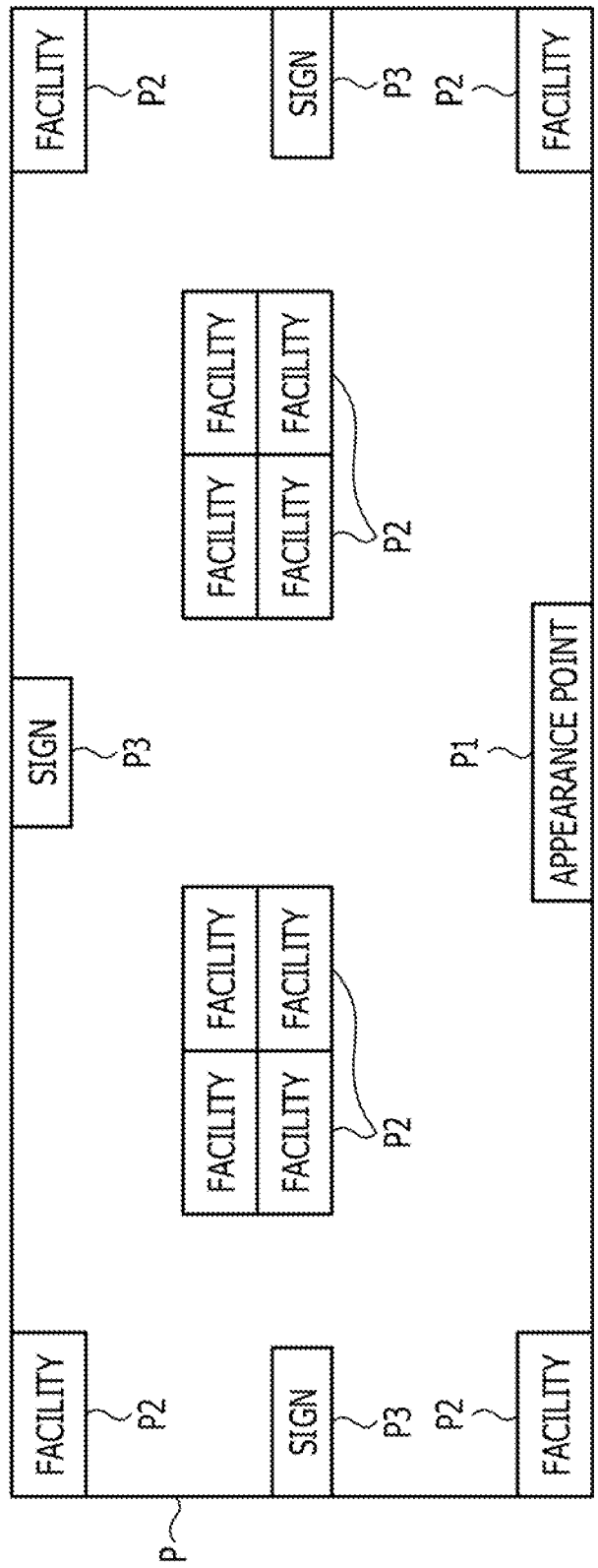
FIG. 8 is an explanatory diagram for explaining a virtual space.

FIG. 8 is an explanatory diagram for explaining the virtual space P. As illustrated in FIG. 8, the simulation management unit 30 generates the virtual space P based on the cell environment (the area of the virtual space, the number of floors, and the position of a wall) in the space information 11. Then, the simulation management unit 30 arranges an appearance point P1, facilities P2, and the like in the virtual space P depending on the network environment (the position and the classification of a node, and the connection relationship between nodes) in the space information 11. The simulation management unit 30 also arranges signs P3 in the virtual space P depending on the positions in the sign system plan 12.

Subsequently, the simulation management unit 30 sets an initial value (Step=0) of the number of steps corresponding to the simulation start time (S3). Thereafter, when repeating the processes in S4 to S9, the simulation management unit 30 increments the set step to advance the time in the simulation. With this procedure, in the processes in S4 to S9, the simulation management unit 30 causes the pedestrian behavior execution unit 50 to execute a simulation at each time that progresses in correspondence to the step. Note that the time width of the simulation to be advanced by incrementing the step can be set freely and, for example, set by the user beforehand in units of several seconds to several tens of seconds.

Subsequently, the simulation management unit 30 generates a pedestrian agent at the appearance point P1 depending on the occurrence probability and the occurrence ratio of each pedestrian classification in the pedestrian information 13 (S4). Specifically, depending on the generated random numbers, the simulation management unit 30 verifies whether the pedestrian agent is to be generated with the set occurrence probability and occurrence ratio. Then, the simulation management unit 30 generates a pedestrian agent of a classification concluded to occur, depending on the verification result. Note that the simulation management unit 30 allocates the identification information such as an ID to each generated pedestrian agent, and accumulates the position information and the cognitive information on the pedestrian agent in the pedestrian agent information accumulation unit 70.

Figure 9:
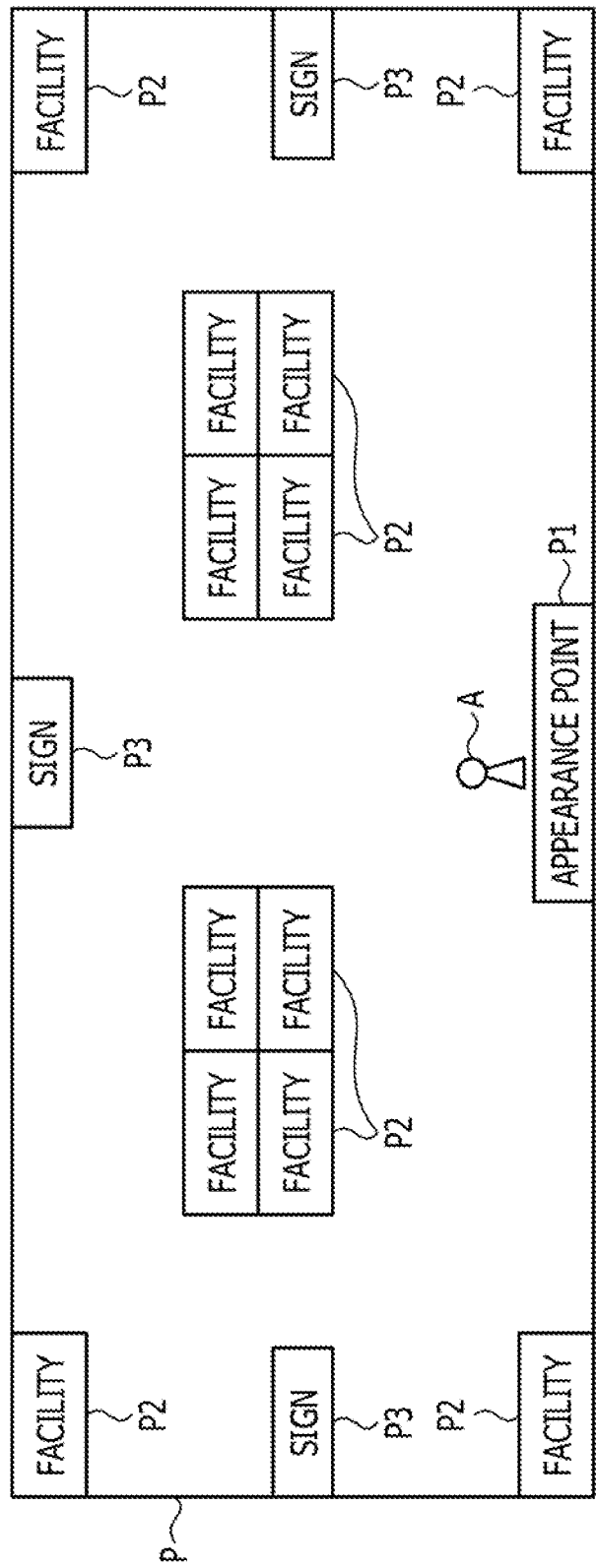
FIG. 9 is an explanatory diagram for explaining the generation of a pedestrian agent.

FIG. 9 is an explanatory diagram for explaining the generation of a pedestrian agent A. As illustrated in FIG. 9, a pedestrian agent A of a classification concluded to occur is generated at the appearance point P1, depending on the occurrence probability and the occurrence ratio of each pedestrian classification. For example, when the occurrence probability is 0.8, the pedestrian agent A is to be generated with a probability of 80% in one step.

Figure 10:
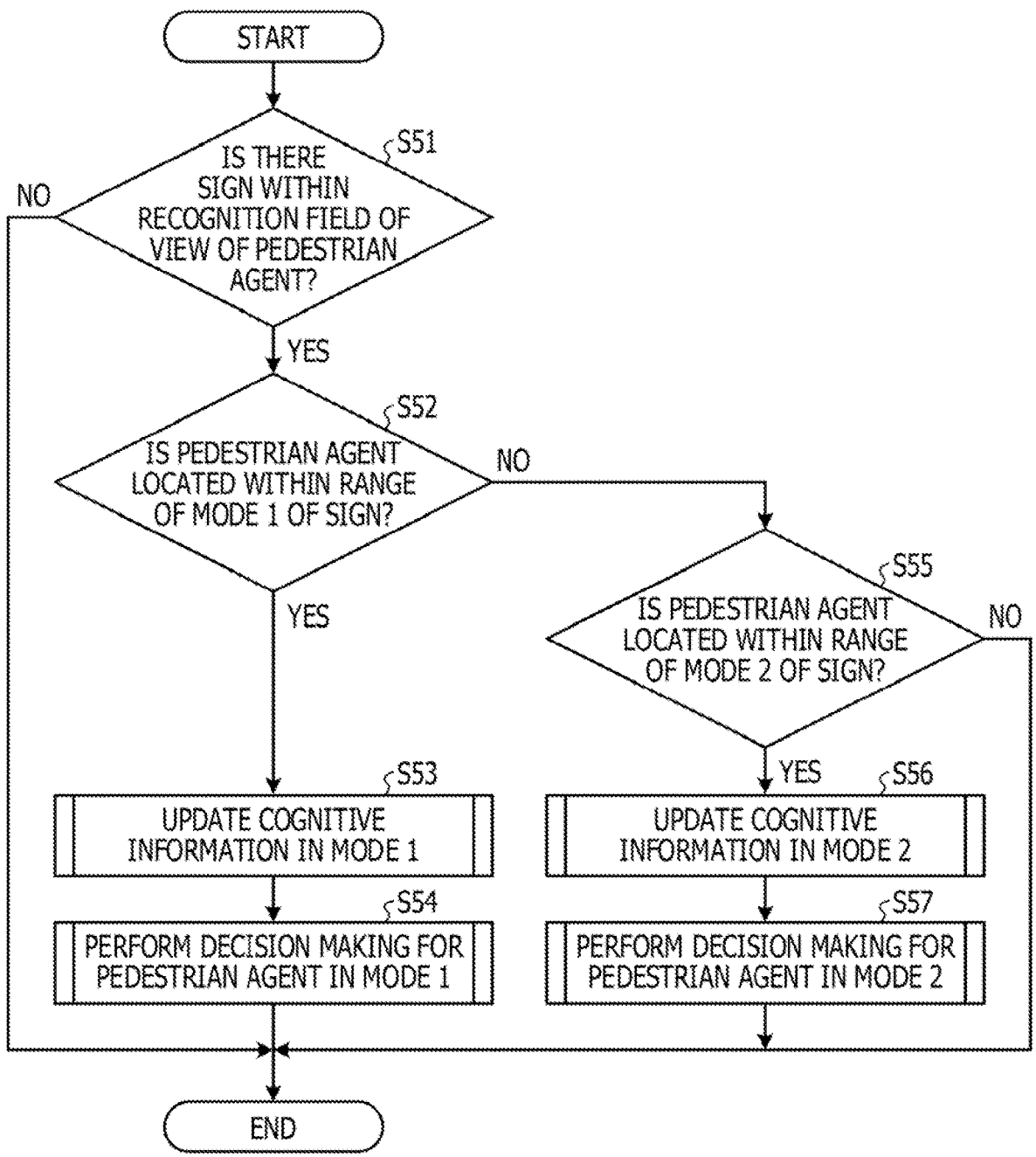
FIG. 10 is a flowchart depicting an update process for the cognitive information and a decision-making process for a pedestrian agent.

Subsequently, the simulation management unit 30 performs the update process of reading the cognitive information on each pedestrian agent A generated in the virtual space P from the pedestrian agent information accumulation unit 70 to update, and a decision-making process of carrying out decision making for the pedestrian agent based on the cognitive information (S5). FIG. 10 is a flowchart depicting the update process for the cognitive information and the decision-making process for the pedestrian agent A. Note that, although FIG. 10 depicts the update process for one pedestrian agent A, the simulation management unit 30 performs the update process in FIG. 10 for all pedestrian agents A generated in the virtual space P.

As illustrated in FIG. 10, once the update process is started, the simulation management unit 30 reads the position information and the cognitive information on the pedestrian agent A accumulated in the pedestrian agent information accumulation unit 70. The simulation management unit 30 also reads the information accumulated in the input information accumulation unit 20. Then, the simulation management unit 30 determines, based on the read information, whether or not a sign is present within the recognition field of view of the pedestrian agent A (step S51). When it is determined that a sign is not present (step S51: No), the simulation management unit 30 terminates the update process and the decision-making process. Then, the simulation management unit 30 passes the cognitive information read from the pedestrian agent information accumulation unit 70 to the pedestrian behavior execution unit 50 as it is.

On the other hand, when it is determined that a sign is present within the recognition field of view of the pedestrian agent A (step S51: Yes), the simulation management unit 30 determines whether or not the pedestrian agent A is located within the range of mode 1 of the sign (step S52). Being located within the range of mode 1 means, for example, being located within the information transmittable range H1 of the sign. When it is determined that the pedestrian agent A is located within the range of mode 1 (step S52: Yes), the simulation management unit 30 executes the update process for the cognitive information in mode 1 (step S53). Following the update process, the simulation management unit 30 executes the decision-making process for the pedestrian agent in mode 1 (step S54). Then, the simulation management unit 30 finishes the process.

On the other hand, when it is determined that the pedestrian agent is not located within the range of mode 1 (step S52: No), the simulation management unit 30 determines whether or not the pedestrian agent is located within the range of mode 2 of the sign (step S55). Being located within the range of mode 2 means, for example, being located within the recognizable range H2. When it is determined that the pedestrian agent is not located within the range of mode 2 (step S55: No), the simulation management unit 30 terminates the update process and the decision-making process. Then, the simulation management unit 30 passes the cognitive information read from the pedestrian agent information accumulation unit 70 to the pedestrian behavior execution unit 50 as it is.

On the other hand, when it is determined that the pedestrian agent is located within the range of mode 2 (step S55: Yes), the simulation management unit 30 executes the update process for the cognitive information in mode 2 (step S56). Following the update process, the simulation management unit 30 executes the decision-making process for the pedestrian agent A in mode 2 (step S57). Then, the simulation management unit 30 finishes the process.

Figure 11:
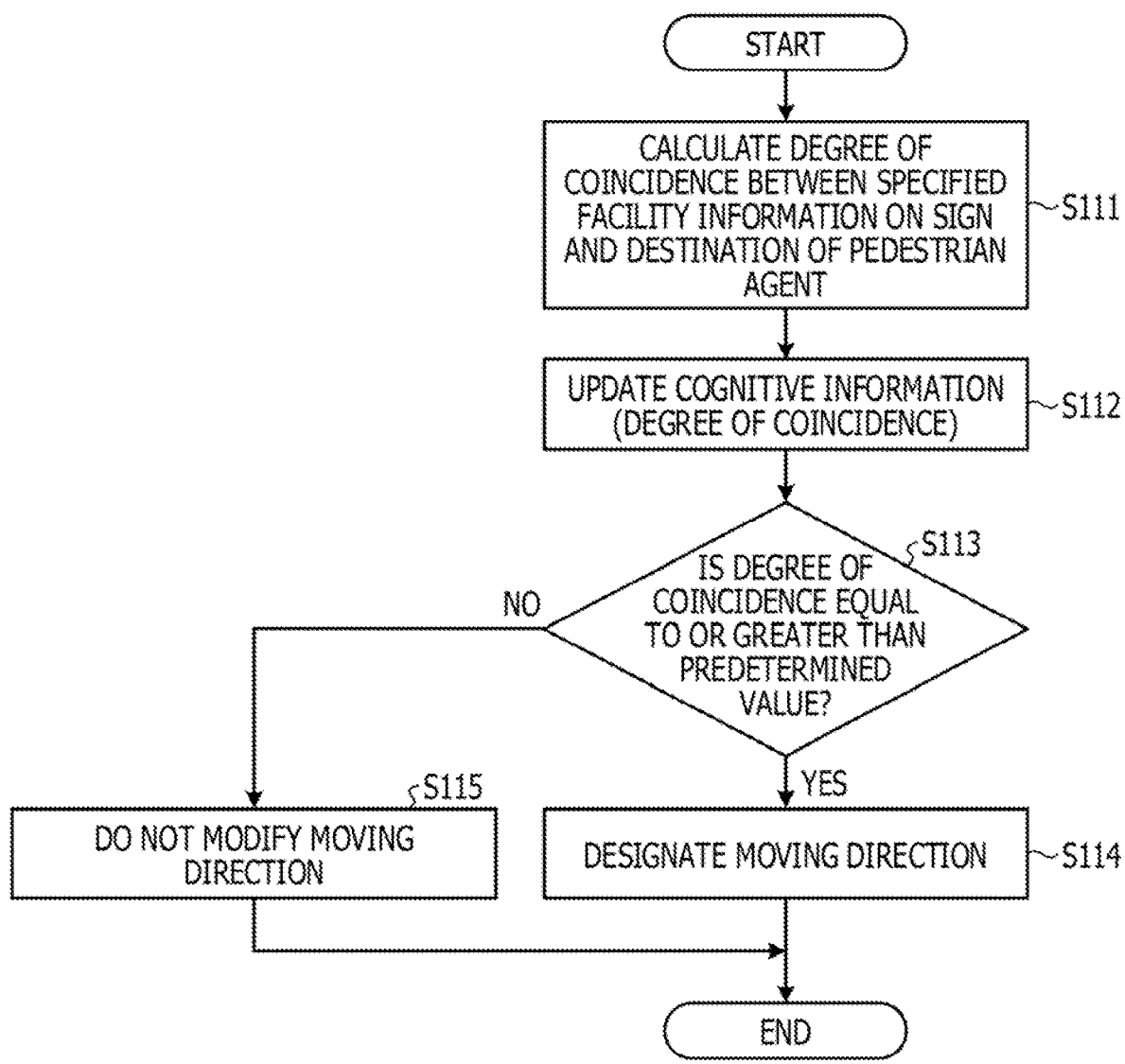
FIG. 11 is a flowchart depicting an update process for the cognitive information and a decision-making process in mode 1.

FIG. 11 is a flowchart depicting the update process for the cognitive information and the decision-making process in mode 1. The process in FIG. 11 corresponds to the processes in steps S53 and S54 in FIG. 10.

Once the update process for the cognitive information in mode 1 is started, the simulation management unit 30 refers to the sign system plan 12 and specifies the facility information on a sign where the pedestrian agent A is located within the information transmittable range H1. The simulation management unit 30 also specifies the destination of the pedestrian agent A with reference to the pedestrian information 13. Then, the simulation management unit 30 calculates the degree of coincidence between the specified facility information and destination (step S111). The simulation management unit 30 updates the cognitive information with the calculated degree of coincidence (step S112). Thereafter, the simulation management unit 30 determines whether or not the calculated degree of coincidence is equal to or greater than a predetermined value (step S113). When the degree of coincidence is equal to or greater than the predetermined value (step S113: Yes), the simulation management unit 30 designates a facility specified by the facility information on the sign as the moving direction (step S114). On the other hand, when the degree of coincidence is less than the predetermined value (step S113: No), the simulation management unit 30 does not modify the moving direction (step S115).

Figure 12:
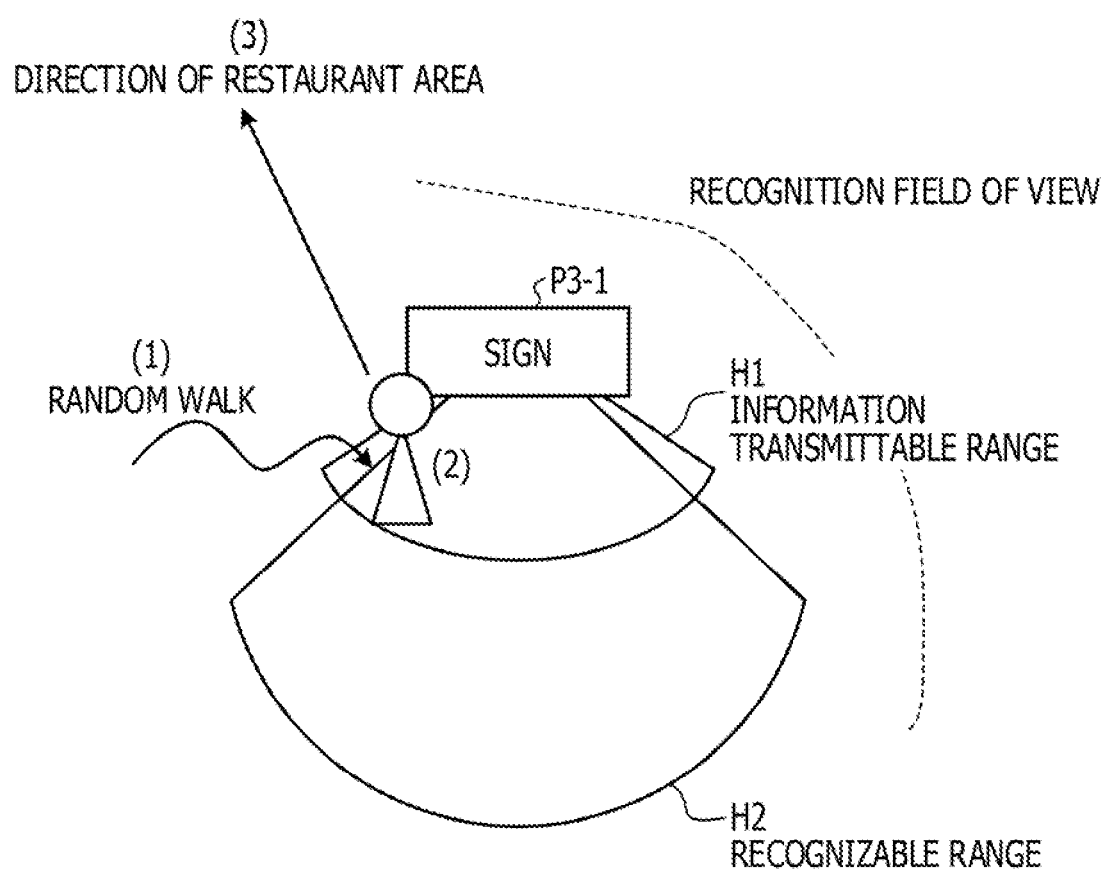
FIG. 12 is an explanatory diagram for explaining the behavior of the pedestrian agent in mode 1.

FIG. 12 is an explanatory diagram for explaining the behavior of the pedestrian agent in mode 1. FIGS. 13A and 13B are an explanatory diagram for explaining the update of the cognitive information on the pedestrian agent in mode 1. The behavior of the pedestrian agent and the update of the cognitive information in mode 1 will be further described with reference to FIGS. 12 and 13.

In the examples in FIGS. 12 and 13, the pedestrian information 13 on the pedestrian agent and the facility information and guidance intention on depicted four signs are assumed as follows.

Pedestrian Information 13 on Pedestrian Agent

Visual recognition distance: 10 meters, Viewing angle: $2\pi$, Destination "0: area (restaurant)"

Sign Number, Facility Information, and Guidance Intention on Sign

P3-1, 0: Restaurant, 0: Arrow Type (Restaurant)
P3-2, 0: Restaurant, 1: Map Type (Restaurant)
P3-3, 3: Clothes Section, 3: Arrow Type (Clothes Section)
P3-4, 3: Clothes Section, 4: Map Type (Clothes Section)

(1) When Pedestrian Agent Enters Information Transmission Range H1 of Sign P3-1

Once the simulation is started, a pedestrian agent is generated at a predetermined time point (see step S4 in FIG. 7). The pedestrian agent performs the random walk until cognizing the position of the destination ("0: area (restaurant)"). The cognitive information at the time point when the pedestrian agent has not entered any of the information transmittable range H1 and the recognizable range H2 of any sign during the random walk is as indicated by the step number "STEP0001" in FIGS. 13A and 13B. In the cognitive information with the step number "STEP0001", "destination, 0: area (restaurant)", "visual recognition distance, 10", "viewing angle, $2\pi$", "moving direction, RW" are described. "RW" stands for random walk. This indicates that, at the time point of the step number "STEP0001", the pedestrian agent has the visual recognition distance, the viewing angle, and the destination as in the setting described in the pedestrian information 13. This also indicates that the pedestrian agent does not yet cognize the direction of the destination and thus is performing the random walk.

The pedestrian agent keeps the random walk ((1) in FIG. 12) and then enters the information transmittable range H1 of the sign P3-1 ((2) in FIG. 12). In addition, the sign P3-1 is present within the recognition field of view designated according to the visual recognition distance and viewing angle of the pedestrian agent. In this case, the simulation management unit 30 executes the update process and the decision-making process in mode 1. The simulation management unit 30 calculates the degree of coincidence between the facility information on the sign P3-1 "0: restaurant" and the destination of the pedestrian agent "0: area (restaurant)". The degree of coincidence is calculated, for example, based on expression (1).

[Math1]

$$\text{Degree of Coincidence} = 1/(1+|\text{Facility Information} - \text{Destination of Pedestrian Agent}|) \quad (1)$$

At this time, the degree of coincidence is given as $1/(1+(0-0))=1$. When the pedestrian agent enters the information transmittable range H1 of the sign P3-1 and the sign P3-1 enters the recognition field of view of the pedestrian agent is assumed as the step number "STEP0020". On this assumption, the cognitive information at the time point of "step S0020" is put into a state of (1) among states indicated by the step number "STEP0020" in FIGS. 13A and 13B. As illustrated in FIGS. 13A and 13B, the cognitive information of (1) includes "sign number, P3-1", "facility information, 0: restaurant", and "guidance intention, 0: arrow type". Furthermore, the cognitive information of (1) includes "degree of coincidence, 1". In the example in FIG. 12, the predetermined value to be compared with the degree of coincidence is assumed as 0.5. Here, since the degree of coincidence "1" is greater than "0.5", the moving direction of the pedestrian agent is assigned as the direction of a facility specified by the facility information, namely, "0: restaurant". The pedestrian agent is simulated so as to move in the moving direction set in the cognitive information. The pedestrian moves in the direction of "0: restaurant" after the step "STEP0020" ((3) in FIG. 12).

(2) When Pedestrian Agent Enters Information Transmission Range H1 of Sign P3-2

Next, a case where the pedestrian agent enters within the information transmittable range H1 of the sign P3-2 at the time point of the step number "STEP0020" will be considered. In this case, "sign number, P3-2", "facility information, 0: restaurant", "guidance intention, 1: map type", and "destination, 0: area (restaurant)" are described in the cognitive information (2) in FIGS. 13A and 13B. The simulation management unit 30 calculates the degree of coincidence in mode $1=1/(1+0-0)=1$ and describes the calculated degree of coincidence in the cognitive information. Since the degree of coincidence 1 is equal to or greater than the predetermined value 0.5, the moving direction is set to "0: restaurant" ((2) in FIGS. 13A and 13B).

(3) When Pedestrian Agent Enters Information Transmission Range H1 of Sign P3-3

Next, a case where the pedestrian agent enters within the information transmittable range H1 of the sign P3-3 at the time point of the step number "STEP0020" will be considered. In this case, "sign number, P3-3", "facility information, 3: clothes section", "guidance intention, 0: arrow type", and "destination, 0: area (restaurant)" are described in the cognitive information ((3) in FIGS. 13A and 13B). The simulation management unit 30 calculates the degree of coincidence in mode $1=1/(1+3-0)=\frac{1}{4}$ and describes the calculated degree of coincidence in the cognitive information. Since the degree of coincidence $\frac{1}{4}$ is less than 0.5, the simulation management unit 30 assigns "RW" as the moving direction, which is the same as the case of STEP0001.

(4) When Pedestrian Agent Enters Information Transmission Range H1 of Sign P3-4

Next, a case where the pedestrian agent enters within the information transmittable range H1 of the sign P3-4 at the time point of the step number "STEP0020" will be considered. In this case, "sign number, P3-4", "facility information, 3: clothes section", "guidance intention, 1: map type (clothes section)", and "destination, 0: area (restaurant)" are described in the cognitive information ((4) in FIGS. 13A and 13B). The simulation management unit 30 calculates the degree of coincidence in mode $1=1/(1+3-0)=\frac{1}{4}$ and describes the calculated degree of coincidence in the cognitive information. Since the degree of coincidence ¼ is less than 0.5, the simulation management unit 30 assigns "RW" as the moving direction, which is the same as the case of STEP0001.

In this manner, in the examples in FIGS. 12 and 13, the moving direction of the pedestrian agent is designated according to the comparison result (degree of coincidence) between "facility information" and "destination" in the process of mode 1.

Figure 14:
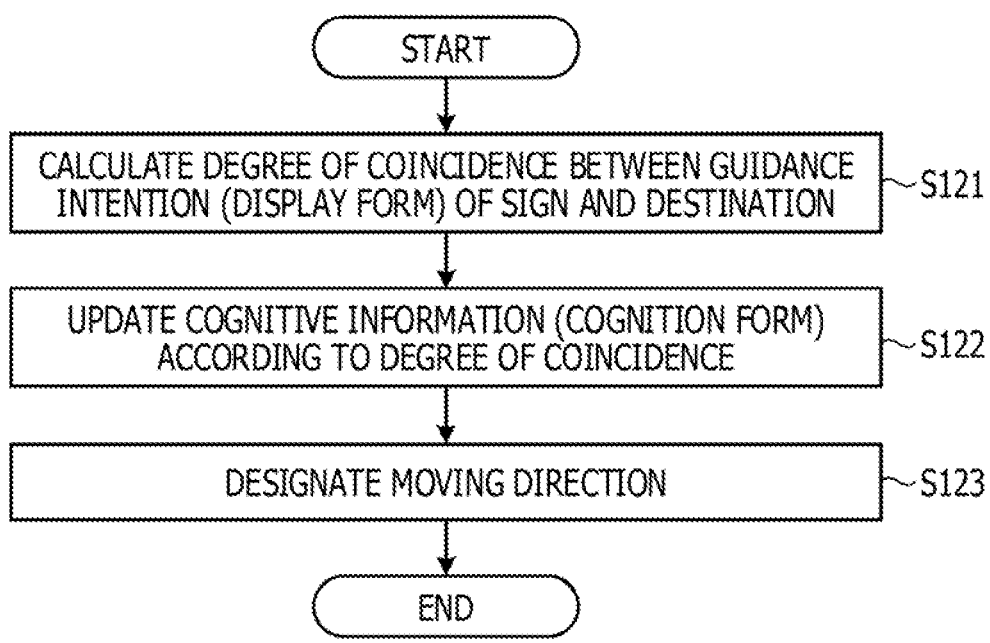
FIG. 14 is a flowchart depicting an update process for the cognitive information and a decision-making process in mode 2.

FIG. 14 is a flowchart depicting the update process for the cognitive information and the decision-making process in mode 2. The process in FIG. 14 corresponds to the processes in steps S56 and S57 in FIG. 10.

Once the update process for the cognitive information in mode 2 is started, the simulation management unit 30 reads the guidance intention of the sign from the sign system plan 12. The simulation management unit 30 also reads the cognitive information from the pedestrian agent information accumulation unit 70. Then, the simulation management unit 30 calculates the degree of coincidence between the guidance intention (display form) and the destination included in the cognitive information (step S121). The simulation management unit 30 updates the cognitive information (cognition form) of the pedestrian agent according to the degree of coincidence (step S122). For example, the simulation management unit 30 updates the viewing angle of the pedestrian agent according to the degree of coincidence. In addition, the simulation management unit 30 designates the moving direction of the pedestrian agent (step S123).

Figure 15A:
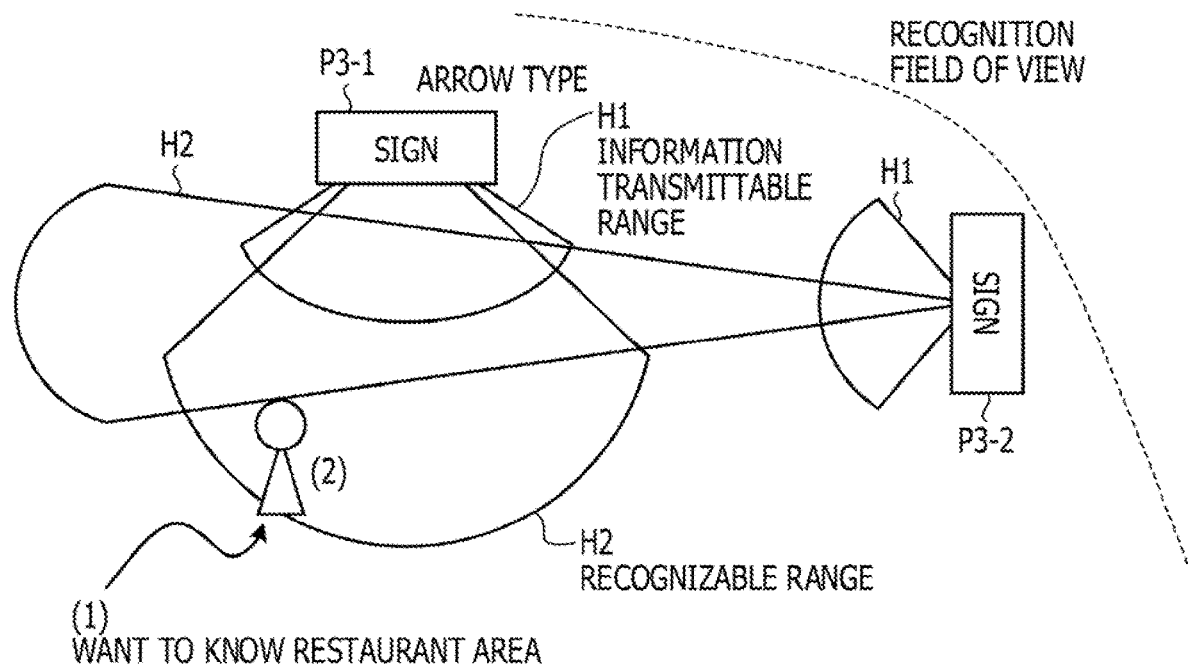
FIG. 15A is an explanatory diagram for explaining an example of the behavior of the pedestrian agent in mode 2.
Figure 15B:
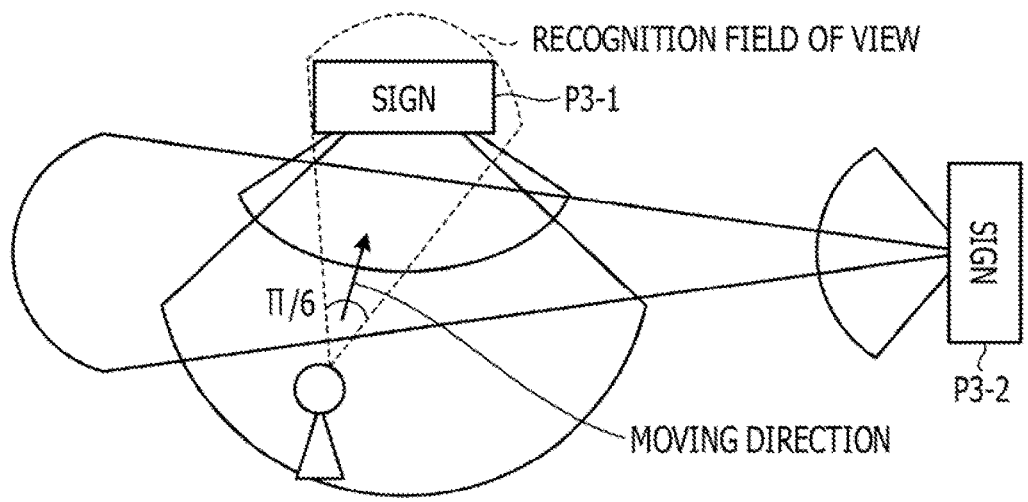
FIG. 15B is an explanatory diagram for explaining an example of the behavior of the pedestrian agent in mode 2.

FIGS. 15A and 15B are explanatory diagrams for explaining an example of the behavior of the pedestrian agent in mode 2. FIG. 16 is an explanatory diagram for explaining an example of the update of the cognitive information on the pedestrian agent in mode 2. The behavior of the pedestrian agent and the state of the cognitive information in mode 2 will be described with reference to FIGS. 15A, 15B, and 16.

The pedestrian information 13 on the pedestrian agent and the facility information and guidance intention of depicted four signs in the examples in FIGS. 15A, 15B, and 16 are assumed as being similar to those in FIGS. 12 and 13.

(1) When Pedestrian Agent Initially Enters Recognizable Range H2 of Sign P3-1

The cognitive information with the step number "STEP0001" in FIG. 16 is similar to the cognitive information at STEP0001 in FIGS. 13A and 13B. The pedestrian agent cannot cognize the destination at this time point and performs the random walk ((1) in FIG. 15A). Next, the pedestrian agent first enters the recognizable range H2 of the sign P341. ((2) in FIG. 15A). The sign P3-1 is located within the recognition field of view of the pedestrian agent. Thus, the simulation management unit 30 starts the process of mode 2. At this time point "STEP0020", "sign number, P3-1", "facility information, 0: restaurant", "guidance intention, 0: arrow type", and "destination, 0: area (restaurant)" are described in the cognitive information. The simulation management unit 30 calculates the degree of coincidence between the destination "0: area (restaurant)" of the pedestrian agent and the guidance intention "0: arrow type" of the sign P3-1. The calculation of the degree of coincidence is according to following expression (2).

[Math2]

$$\text{Degree of Coincidence} = 1/(1 + |\text{Guidance Intention} - \text{Destination of Pedestrian Agent}|) \quad (2)$$

Accordingly, at the time point of "STEP0020", the degree of coincidence=1/(1+0−0)=1 is obtained.

In the process of mode 2, the simulation management unit 30 adjusts the cognition form of the pedestrian agent, for example, the cognitive field of view, according to the degree of coincidence. This is because it is considered that there is a change in the area of the cognitive field of view between a case where people concentrate attention to something and a case where people look around vaguely. In the embodiment, the viewing angle of the pedestrian agent is narrowed when a condition for bringing about a state in which the attention is directed to a particular sign is satisfied, for example, when the degree of coincidence between the guidance intention and the destination becomes a predetermined value or greater. The correspondence between the viewing angle of the pedestrian agent after the modification and the degree of coincidence is as follows. Note that, in this example, the default viewing angle is set to $2\pi$.

Viewing angle Degree of Coincidence $\pi$ . . . Degree of Coincidence≤⅙

$\pi/2$ . . . ⅙<Degree of Coincidence≤⅓

$\pi/3$ . . . ⅓<Degree of Coincidence≤½

$\pi/6$ . . . ½<Degree of Coincidence≤1

In the example in FIG. 15B, since the degree of coincidence is "1" in STEP0020, the viewing angle is narrowed to $\pi/6$ according to the above correspondence. There is no modification in the visual recognition distance. Then, the simulation management unit 30 sets the sign P3-1 located within the recognition field of view of the pedestrian agent as the moving direction ((1) in FIG. 16).

After the step "STEP0020", the pedestrian agent moves toward the sign P3-1, which is the moving direction. Then, the recognizable range H2 of another sign P3-2 is crossed in the course of approaching the sign P3-1. However, since the sign P3-2 is not located within the recognition field of view of the pedestrian agent (see S51 in FIG. 10), there is no update of the cognitive information based on the sign P3-2. Then, the pedestrian agent further keeps moving and enters the information transmittable range H1 of the sign P3-1. This time point is assumed as a step "STEP0030" ((2) in FIG. 16). Since the pedestrian agent is located within the information transmittable range H1 of the sign P3-1, the process of mode 1 is executed. The simulation management unit 30 calculates the degree of coincidence between the facility information and the destination. The degree of coincidence at the step "STEP0030" is "1" and is equal to or greater than the predetermined value 0.5, such that the moving direction is set to the facility information "0: restaurant", When beginning the process of mode 1, the simulation management unit 30 restores the visual recognition distance and the viewing angle of the pedestrian agent back to the default $2\pi$ ((2) in FIG. 16).

(2) When Pedestrian Agent Initially Enters Recognizable Range H2 of Sign P3-2

In the examples in FIGS. 15A, 15B, and 16, the pedestrian agent initially enters the recognizable range H2 of the sign P3-1 having the display form of the arrow type, among the two signs P3-1 and P3-2. In the examples in FIGS. 17A to 17D, and 18, a case where the pedestrian agent initially enters the recognizable range H2 of the sign P3-2 having the display form of the map type will be described.

Figure 17A:
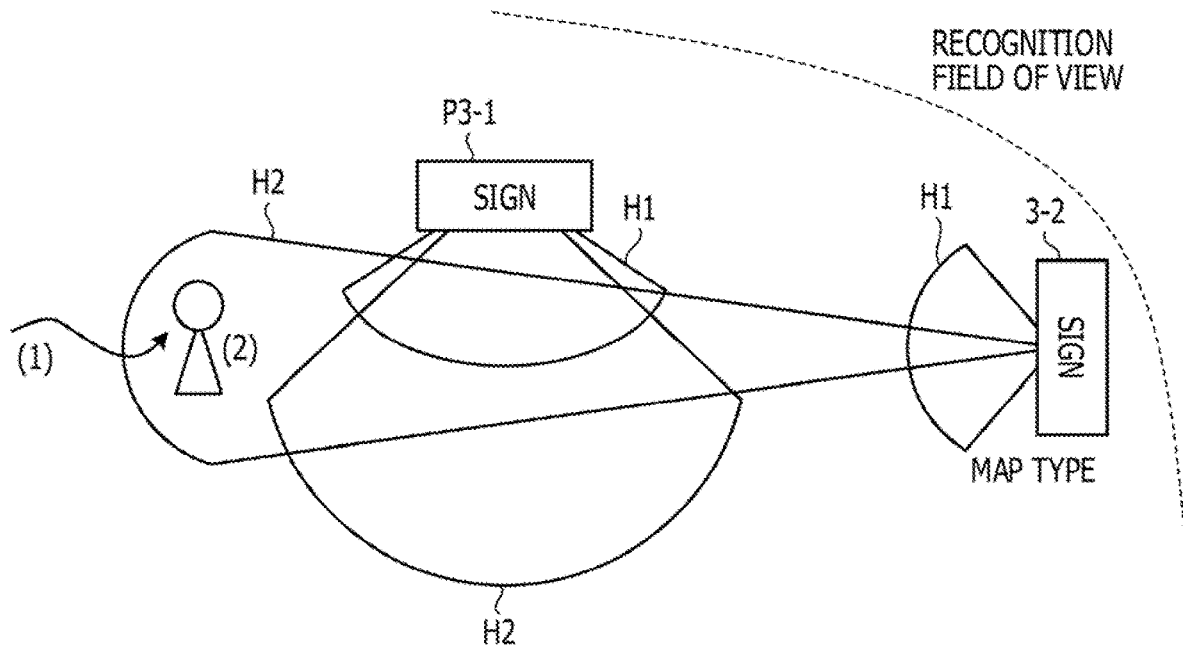
FIG. 17A is an explanatory diagram for explaining another example of the behavior of the pedestrian agent in mode 2.
Figure 17B:
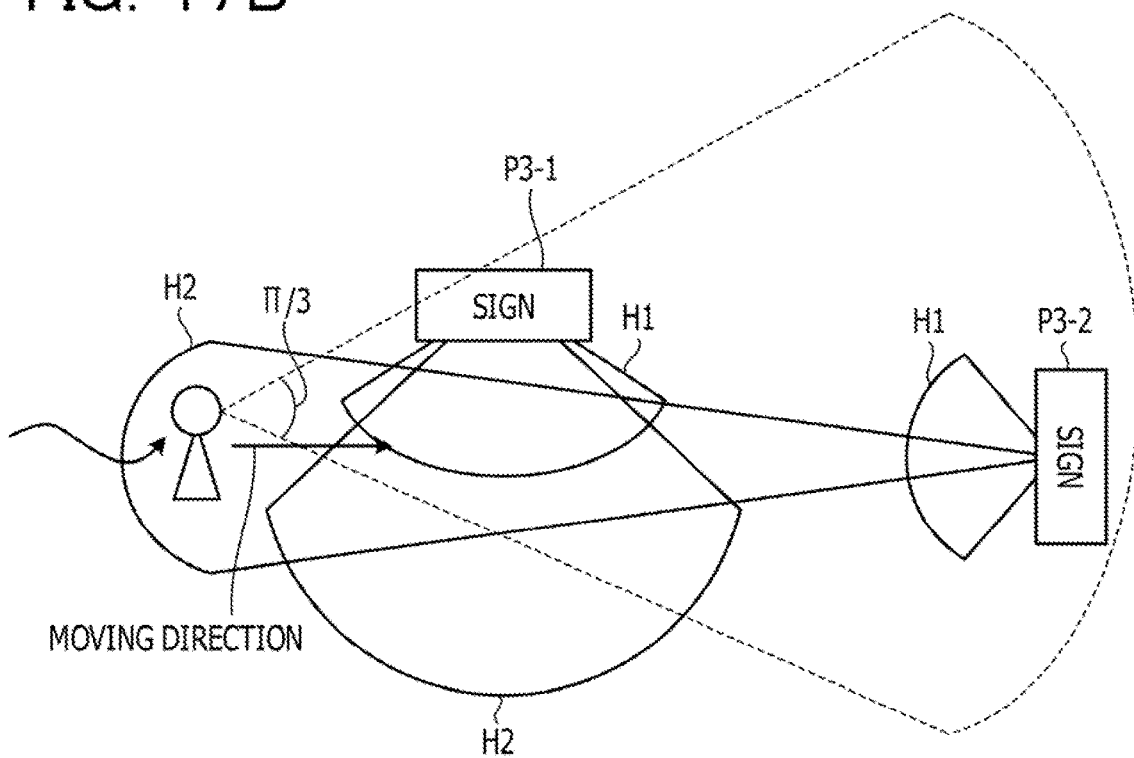
FIG. 17B is an explanatory diagram for explaining another example of the behavior of the pedestrian agent in mode 2.
Figure 17C:
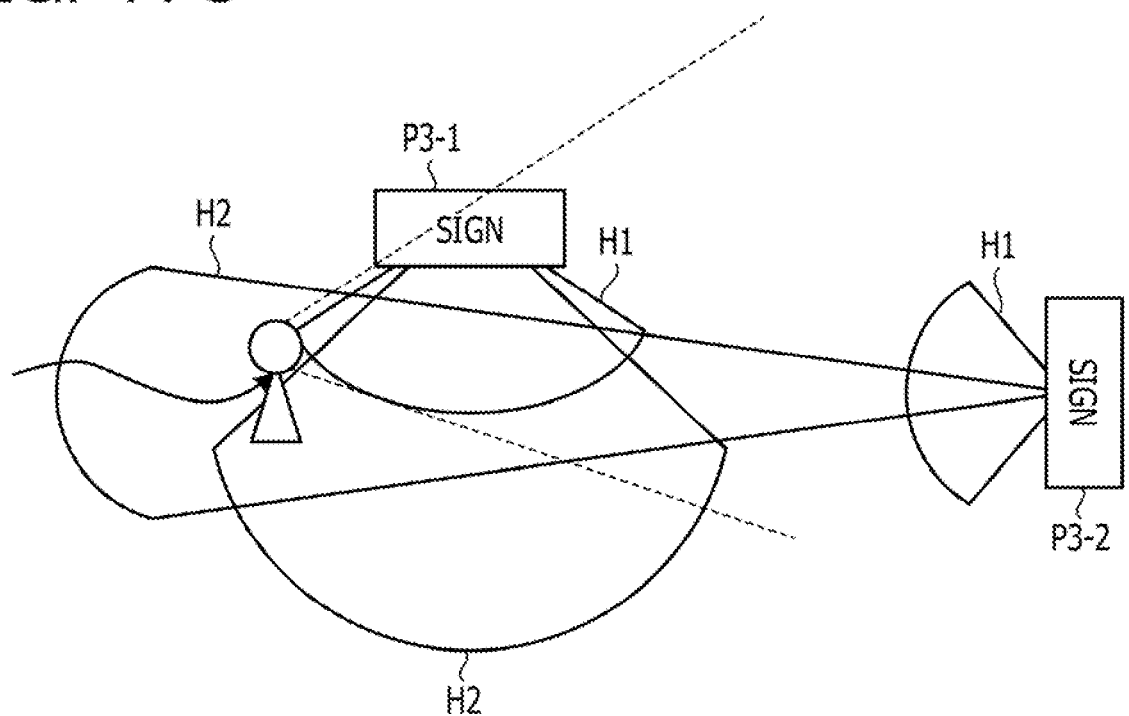
FIG. 17C is an explanatory diagram for explaining another example of the behavior of the pedestrian agent in mode 2.
Figure 17D:
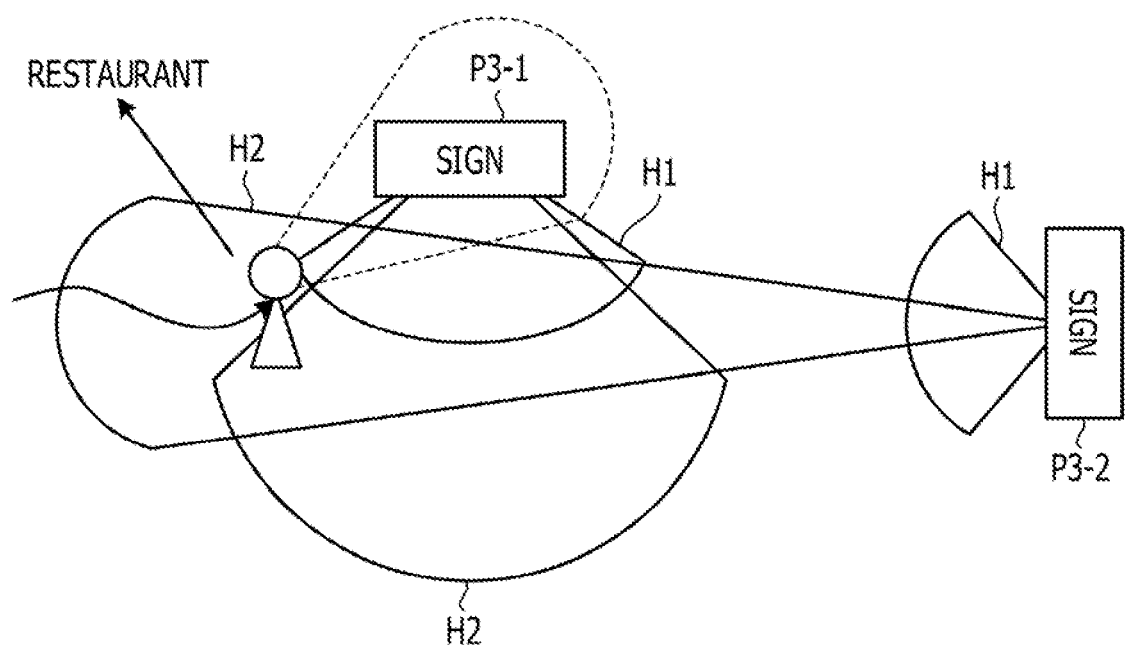
FIG. 17D is an explanatory diagram for explaining another example of the behavior of the pedestrian agent in mode 2.
Figure 18:
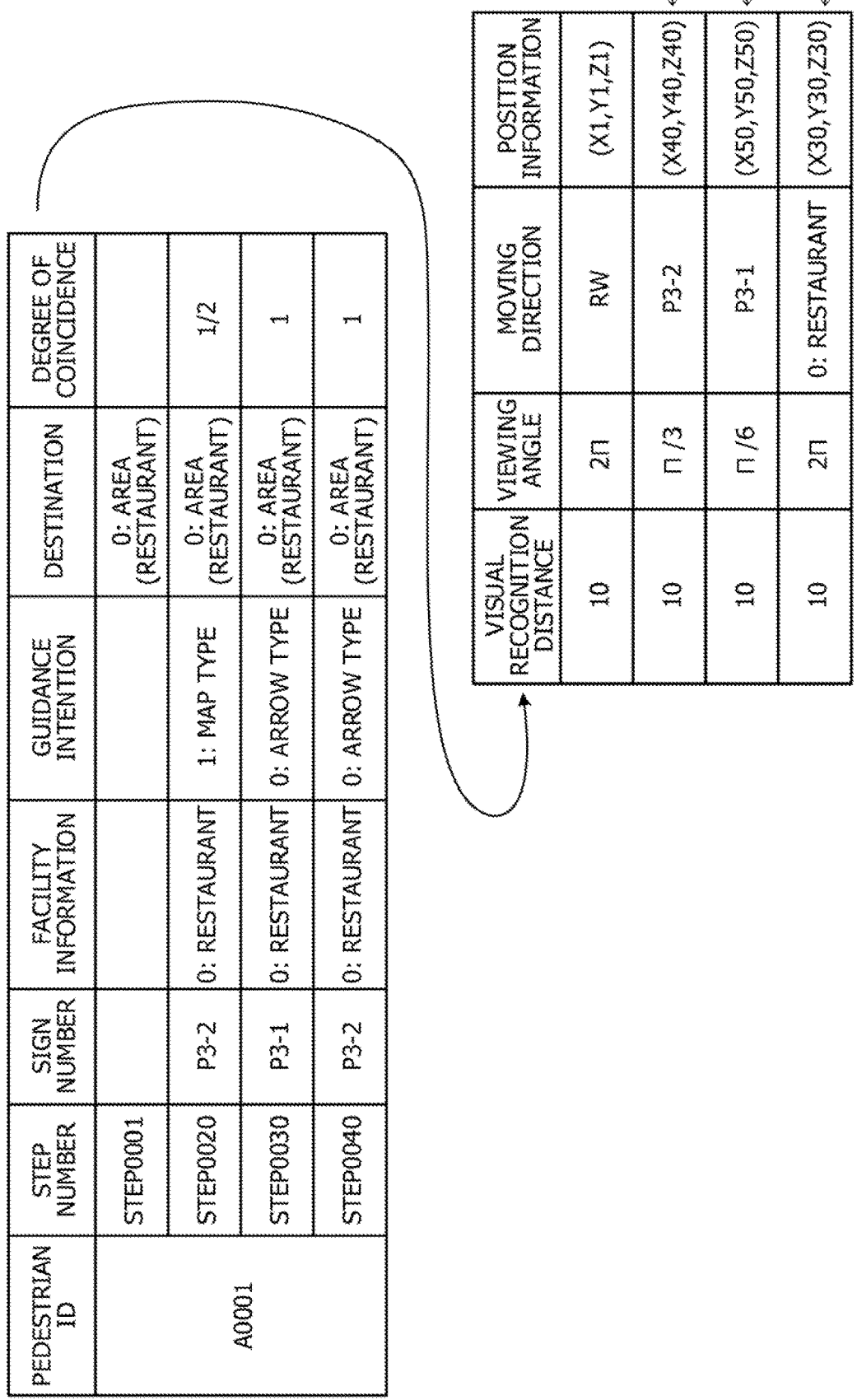
FIG. 18 is an explanatory diagram for explaining another example of the update of the cognitive information on the pedestrian agent in mode 2.

FIGS. 17A to 17D are explanatory diagrams for explaining another example of the behavior of the pedestrian agent in mode 2. FIG. 18 is an explanatory diagram for explaining another example of the update of the cognitive information on the pedestrian agent in mode 2. The behavior of the pedestrian agent and the state of the cognitive information in mode 2 will be further described with reference to FIGS. 17A to 17D, and 18.

The cognitive information with the step number "STEP0001" in FIG. 18 is similar to the cognitive information of STEP0001 in FIGS. 13 and 16. The pedestrian agent cannot cognize the destination at this time point and performs the random walk ((1) in FIG. 17A). Next, the pedestrian agent first enters the recognizable range H2 of the sign P3-2 ((2) in FIG. 17A). The sign P3-2 is located within the recognition field of view of the pedestrian agent (FIG. 17B). Thus, the simulation management unit 30 starts the process of mode 2. At this time point "STEP0020", "sign number, P3-2", "facility information, 0: restaurant", "guidance intention, 1: map type", and "destination, 0: area (restaurant)" are described in the cognitive information.

The simulation management unit 30 calculates the degree of coincidence at the time point of the step "STEP0020". The degree of coincidence=1/(1+1−0)=½ is obtained. According to the above-mentioned correspondence, the viewing angle after the modification in the case of the degree of coincidence ½ is given as π/3. Thus, the simulation management unit 30 modifies the viewing angle at the time point of the step "STEP0020" and assigns the direction of the sign P3-2 as the moving direction (FIG. 18, (1)).

The pedestrian agent keeps moving toward the direction of the sign P3-2 (FIG. 17B). At this time, the pedestrian agent enters the recognizable range H2 of the sign P3-1 before entering the information transmittable range H1 of the sign P3-2 (FIG. 17C). At this time, the sign P3-1 is located within the recognition field of view of the pedestrian agent. Therefore, the simulation management unit 30 executes the process of mode 2 for the sign P3-1. The degree of coincidence between the guidance intention and the destination at the step number "STEP0030" is given as 1/(1+0−0)=1. Therefore, the simulation management unit 30 modifies the viewing angle to the recognition field of view π/6 corresponding to the degree of coincidence 1. Then, the simulation management unit 30 assigns the sign P3-1 as the moving direction (FIG. 18, (2)).

In the following stage, the pedestrian agent moves in the direction of the sign P3-1 (FIG. 17D) and enters the information transmittable range H1 of the sign. P3-1. The simulation management unit 30 executes the process of mode 1. The simulation management unit 30 calculates the degree of coincidence between the facility information on the sign P3-1 and the destination of the pedestrian agent. The degree of coincidence is given as 1/(1+0−0)=1. Since 1 is greater than the predetermined value 0.5, the simulation management unit 30 sets the facility information "0: restaurant" as the moving direction. In addition, since the process of mode 1 has been started, the simulation management unit 30 restores the viewing angle to the default 2π (FIG. 18, (3)).

As described above, in the process of mode 2, the viewing angle of the pedestrian agent is modified according to the degree of coincidence between the guidance intention of the sign and the destination of the pedestrian agent. As a consequence, the state of the pedestrian agent who has found a sign and is distracted by the sign is reflected in the simulation, and a simulation result more closely in line with the reality can be obtained. In addition, in the process of mode 2, the viewing angle of the pedestrian agent is modified according to the degree of coincidence. Therefore, by setting the numerical value of the guidance intention in consideration of the display form of the sign, a simulation result in consideration of the display form of the sign can be obtained. In this manner, according to the embodiment, a variety of factors that affect human perception can be expressed in numbers and reflected in simulation results. Note that the above examples have been configured such that the extent of dispersion and concentration of attention is expressed in the simulation by modifying the viewing angle of the pedestrian agent according to the degree of coincidence. However, the present invention is not limited to this configuration and may be configured such that the perceptual range of the pedestrian agent expressed by an element other than the viewing angle is modified.

Referring back to FIG. 7, the pedestrian behavior execution unit 50 simulates the walking behavior of each pedestrian agent A depending on the cognitive information updated and the decision made in S5 for each pedestrian agent A (S6). Specifically, the pedestrian behavior execution unit 50 calculates the direction and the walking amount obtained by walking during the step, in accordance with the cognitive information on and the decision made for each pedestrian agent A. This simulation result in S6 is output to the simulation management unit 30 and accumulated in the pedestrian agent information accumulation unit 70.

Note that, when an area assumed as a goal is not fixed in the cognitive information cognized by each pedestrian agent A, a near Waypoint is selected at random, and walking aiming at the selected Waypoint (the direction and the walking amount) is calculated. With this configuration, it is possible to reproduce the behavior when having lost sight of the relationship between the destination and the self-position, such as "wandering" or "getting lost", which is the movement of a real person.

Subsequently, the simulation result output unit 60 draws the virtual space P and each pedestrian agent A in the virtual space P on a screen of a display device, depending on the simulation results accumulated in the pedestrian agent information accumulation unit 70 (S7).

Figure 19:
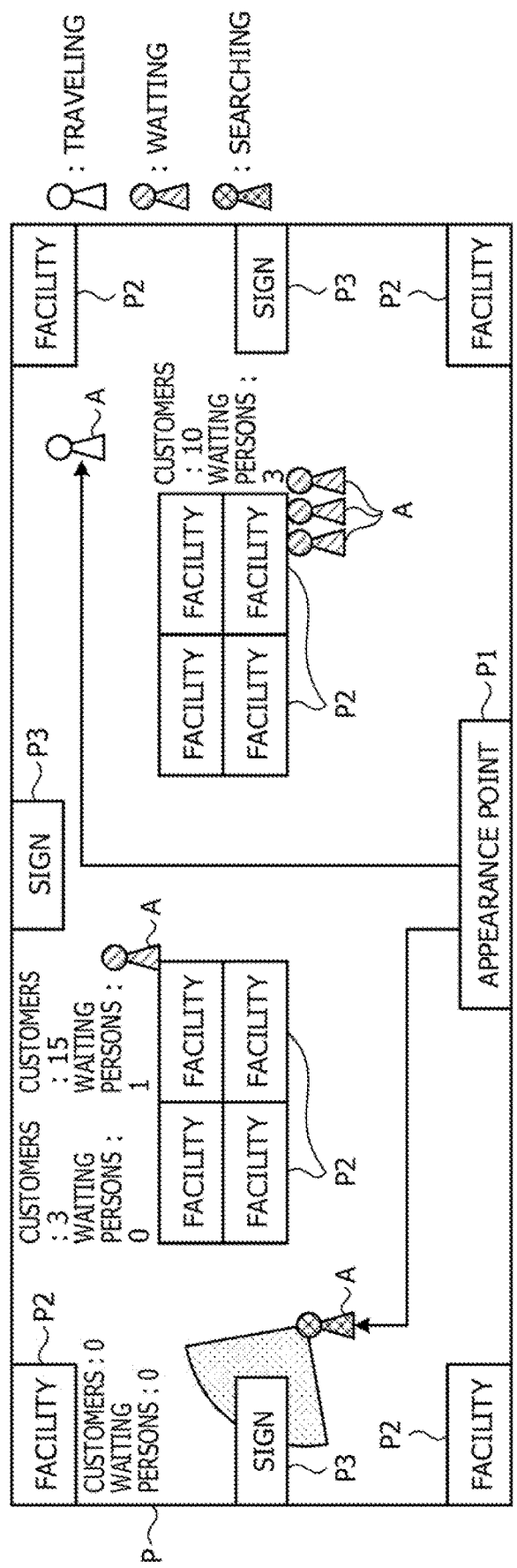
FIG. 19 is an explanatory diagram for explaining drawing of a virtual space and pedestrian agents.

FIG. 19 is an explanatory diagram for explaining drawing of the virtual space P and the pedestrian agents A. As illustrated in FIG. 19, the simulation result output unit 60 draws the current position of each pedestrian agent A in the virtual space P and a route on which each pedestrian agent A has moved, depending on the simulation result calculated for each step. At this time, the simulation result output unit 60 may vary the display form (for example, the color) according to the state of the pedestrian agent A, such as traveling, waiting, and searching. The simulation result output unit 60 may also draw the state of each facility P2 (the number of customers and the number of waiting persons) depending on the simulation result calculated for each step. This allows the user to easily recognize the movement of each pedestrian agent A in each step.

For example, a pedestrian agent A in a state in which an area assumed as a goal is not designated is drawn as being traveling, in which a movement such as "wandering" or "getting lost" is performed. In addition, a pedestrian agent A having arrived at the target facility P2 is drawn as being waiting. Furthermore, a pedestrian agent A having cognized area information (guidance information) on an area assumed as a goal and moving is drawn as being searching. This allows the user to easily recognize the state of each pedestrian agent A.

Subsequently, the simulation management unit 30 determines whether or not the process has been completed up to the final step (the time to terminate the simulation) set in advance (S8). When the process has not been completed (S8: No), the simulation management unit 30 increments the number of steps (S9) and returns the process to S4.

When the process has been completed (S8: Yes), the simulation result output unit 60 outputs the total result obtained by totaling the simulation results in the pedestrian agent information accumulation unit 70, for example, to a screen of a display device (S10). This allows the user to easily recognize the total result of the simulation.

Figure 20:
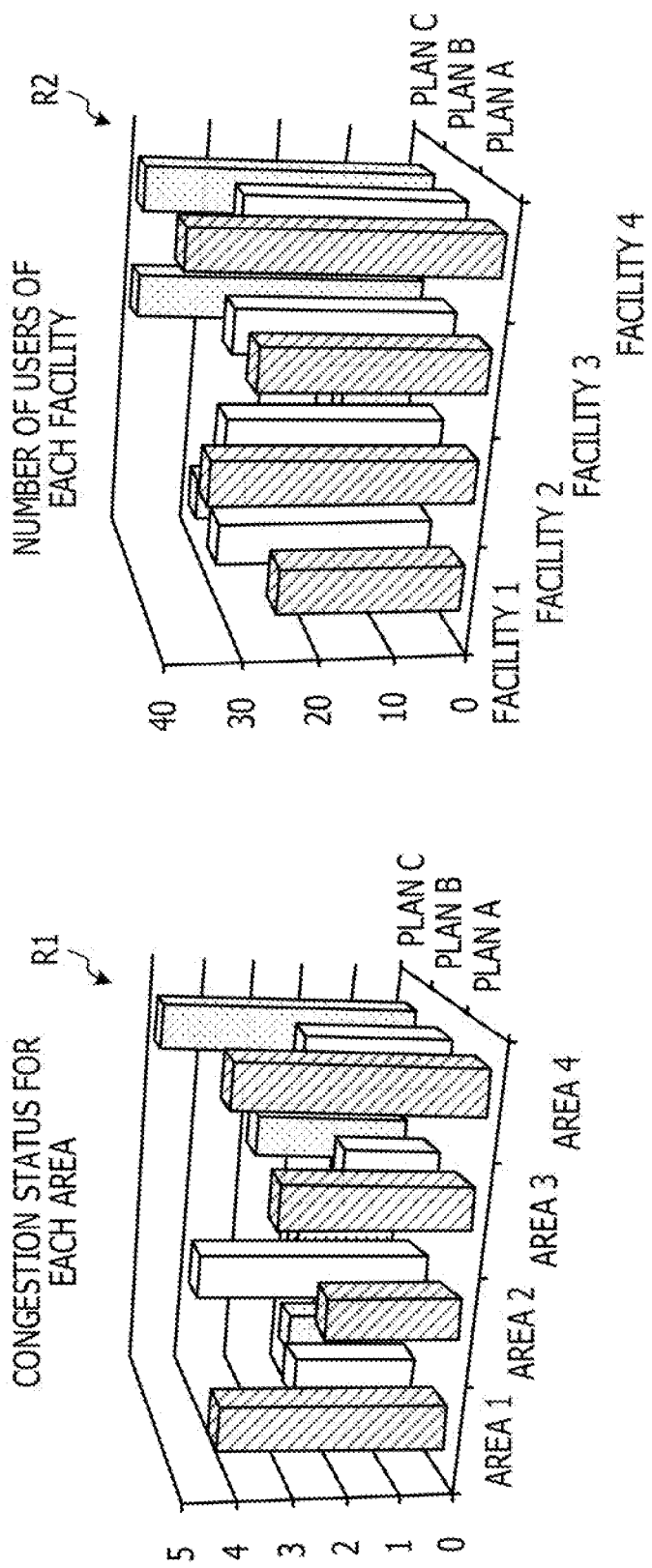
FIG. 20 is an explanatory diagram for explaining output examples of simulation results.

FIG. 20 is an explanatory diagram for explaining output examples of simulation results R1 and R2. As illustrated in FIG. 20, the simulation result output unit 60 makes totals for the simulation results R1 and R2 for each sign system plan (plans A, B and C), and outputs the obtained total results to a screen of a display device. For example, the simulation result R1 illustrating the congestion status for each area as a bar graph may be output for the sign system plans (plans A, B, and C). The congestion status for each area includes, for example, the number of users, waiting time, and moving time for each facility, and the number of facilities used by each pedestrian agent A. In addition, the simulation result R2 illustrating the number of users of each facility as a bar graph may be output for the sign system plans (plans A, B, and C).

Modifications

In the above embodiment, a change in behavior (cognition) of the pedestrian agent according to visual information (display form) transmitted by the sign is simulated. However, information that affects human behavior is not restricted to visual information. Thus, an example of simulating a change in behavior (cognition) of the pedestrian agent according to information that stimulates a sense of hearing or smell will be described as a modification. In addition, a source that provides information that affects human behavior is not restricted to the sign. Thus, simulation of a change in behavior (cognition) of the pedestrian agent according to information emitted by a store will be described as a modification.

The basic configuration and functions of a simulation program, a simulation method, and a simulation device according to the modification are similar to those in the above embodiment (see FIGS. 1 and 7), and accordingly only the differences will be described below.

Figure 21:
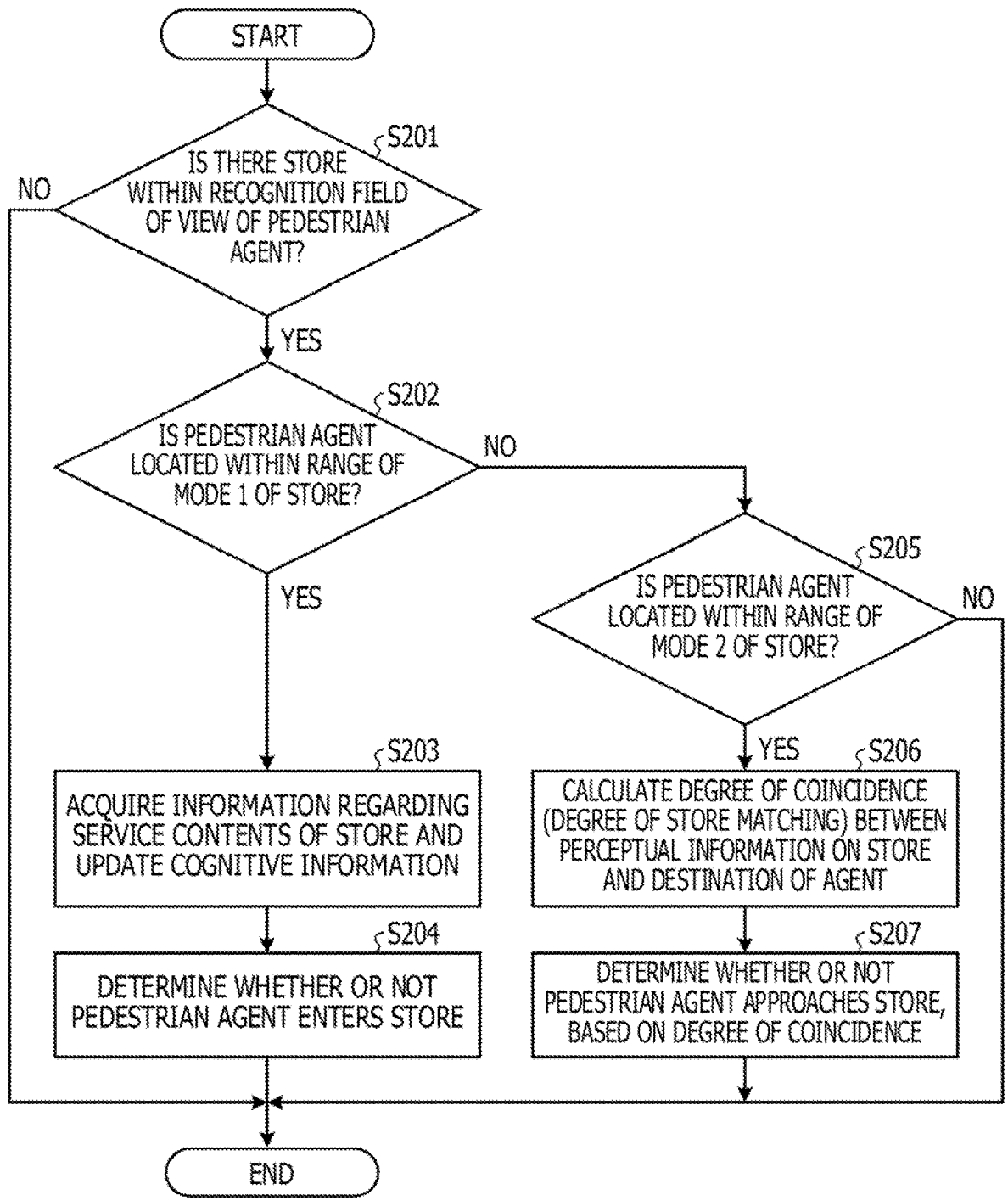
FIG. 21 is a flowchart depicting an update process for the cognitive information and a decision-making process according to a modification.

The simulation device 1A (see FIG. 1) according to the modification differs from the simulation device of the first embodiment in the contents of the modification process for the cognitive information and the decision-making process. FIG. 21 is a flowchart depicting an update process for the cognitive information and a decision-making process according to the modification.

The process in FIG. 21 is executed instead of or together with the process in FIG. 10 of the first embodiment. In order to implement the process in FIG. 21, in the modification, the sign system plan 12 and the pedestrian information 13 are altered. FIG. 22 is an explanatory diagram for explaining a sign system plan 12A according to the modification. In addition, FIG. 23 is an explanatory diagram for explaining pedestrian information 13A according to the modification.

As illustrated in FIG. 22, the sign system plan 12A of the modification includes not only the information on the sign but also information about a structure other than the sign, such as a store arranged in the virtual space. The sign system plan 12A of the modification may include information about any structure as long as the structure can provide information that causes a change in perception of the pedestrian agent. For example, the sign system plan 12A of the modification may include information about information that stimulates a sense of hearing or smell, such as smell of food, smell of perfume, or the like, or music drifting from a store. The sign system plan 12A of the modification may include the sign system plan 12 in FIG. 3 in addition to the information in FIG. 22.

In the example in FIG. 22, "store number", "position", "information transmittable range", "recognizable range", "service information", and "perceptual information" are described. "Store number" is a number that specifies a store arranged in the virtual space. "Position" indicates a position where a store is arranged in the virtual space, "Position" includes, for example, coordinates in the virtual space. "Information transmittable range" and "recognizable range" are similar to the information transmittable range and the recognizable range in FIG. 3. "Service information" specifies a service provided by the corresponding store, "Perceptual information" is any type of information provided by the corresponding store. "Perceptual information" is, for example, information that stimulates a sense of smell, taste, hearing, or the like of the pedestrian agent.

In the example in FIG. 22, "position, (20, 80, 60)", "information transmittable range, distance, 10", "information transmittable range, angle, $\frac{2}{3}\pi$", "recognizable range, distance, 30", and "recognizable range, angle, $\frac{2}{3}\pi$" are described in association with "store number, 1". Furthermore, "service information, 0: western food", and "perceptual information, 0: smell of western food" are described in association with "store number, 1". This description indicates that the position in the virtual space of a store specified by the store number "1" is specified by the coordinates (20, 80, 60). This description also indicates that the information transmittable range of the store specified by the store number "1" is within a radius of 10 meters and has an angle of $\frac{2}{3}\pi$. This description also indicates that the recognizable range of the store specified by the store number "1" is within a radius of 30 meters and has an angle of $\frac{2}{3}\pi$. This description also indicates that a service provided by the store specified by the store number "1" is the provision of a western food represented by the numerical value "0", for example, a western restaurant. This description also indicates that the store specified by the store number "1" transmits information that stimulates the perception, namely, "smell of western food" represented by the numerical value "0", within the recognizable range.

In addition, as illustrated in FIG. 23, the pedestrian information 13A of the modification includes information other than the store category as information on the destination, in addition to the pedestrian information 13 in FIG. 5. The pedestrian information of the modification includes information on preferences, temporary desire, or the like of the pedestrian agent related to the perceptual information. For example, in the example in FIG. 23, "0: wanting to eat hamburger steak" and "1: wanting to eat ramen" are described as "destination". This means that the pedestrian agent has no particular destination, but assumes any ordinary place where the hamburger steak is provided, as the destination. This also means that the pedestrian agent has no particular destination, but assumes any ordinary place where the ramen is provided, as the destination. Here, if the numerical value given to "wanting to eat hamburger steak" and the numerical value given to a facility that provides the hamburger steak in "facility information" and "guidance intention" in FIG. 3 are the same, the preferences or the like of the pedestrian agent can be described as "destination" in the pedestrian information also in the first embodiment. Note that, although "destination" is associated with "pedestrian classification" in the example in FIG. 23, a more detailed condition may be set as "destination" in association with "pedestrian ID".

Referring back to FIG. 21, the flow of the cognitive information update process and the decision-making process of the modification will be described. The process in FIG. 21 is executed in step S5 in FIG. 7. The processes in the modification are similar to the processes of the above embodiment except the process in FIG. 21.

First, the simulation management unit 30 determines whether or not there is a store within the recognition field of view of the pedestrian agent (step S201). When it is determined that there is no store (step S201: No), the simulation management unit 30 terminates the cognitive information update process and the decision-making process. On the other hand, when it is determined that there is a store (step S201: Yes), the simulation management unit 30 determines whether or not the pedestrian agent is located within the information transmittable range H1 of the store (within the range of mode 1) (step S202). When it is determined that the pedestrian agent is located (step S202: Yes), the simulation management unit 30 acquires information regarding the service contents of the store and updates the cognitive information on the pedestrian agent (step S203). For example, the simulation management unit 30 acquires "service information" on the store. Then, the simulation management unit 30 calculates the degree of coincidence between "destination" of the pedestrian agent and "service information" on the store. If the degree of coincidence is equal to or greater than a predetermined value, the simulation management unit 30 assumes that the target service contents has been obtained and causes the pedestrian agent to enter the store (step S204).

When it is determined that the pedestrian agent is not located within the information transmittable range H1 of the store (step S202: No), the simulation management unit 30 determines whether or not the pedestrian agent is located within the recognizable range H2 of the store (within the range of mode 2) (step S205). When it is determined that the pedestrian agent is not located (step S205: No), the simulation management unit 30 terminates the process. On the other hand, when it is determined that the pedestrian agent is located (step S205: Yes), the simulation management unit 30 calculates the degree of coincidence (degree of store matching) between the perceptual information on the store and the destination (preferences) of the pedestrian agent (step S206). Then, the simulation management unit 30 determines whether or not the pedestrian agent approaches the store, based on the calculated degree of coincidence (step S207). For example, the simulation management unit 30 determines that the pedestrian agent approaches the store if the degree of coincidence is equal to or greater than a predetermined value, and determines that the pedestrian agent moves away from the store if the degree of coincidence is less than the predetermined value. This completes the cognitive information update process and the decision-making process in the modification.

(1) Process in Mode 1 According to Modification

Figure 24A:
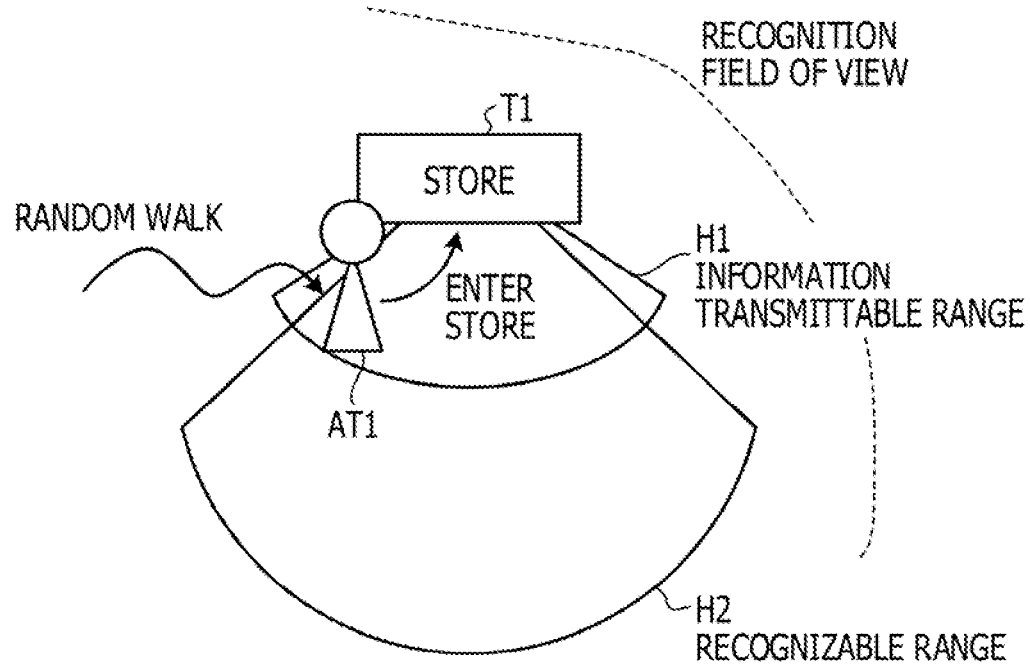
FIG. 24A is an explanatory diagram for explaining the behavior of the pedestrian agent in mode 1 according to the modification.
Figure 24B:
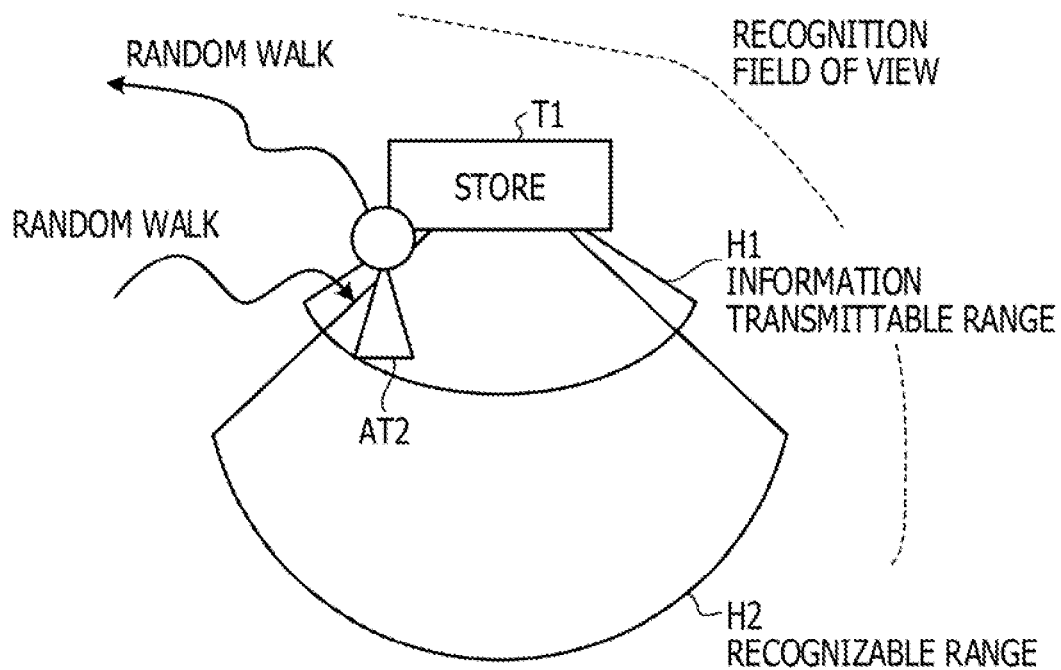
FIG. 24B is an explanatory diagram for explaining the behavior of the pedestrian agent in mode 1 according to the modification.

FIGS. 24A and 24B are explanatory diagrams for explaining the behavior of the pedestrian agents in mode 1 according to the modification. FIG. 25 is an explanatory diagram for explaining the update of the cognitive information on the pedestrian agent in mode 1 according to the modification.

It is assumed that the pedestrian information 13A on pedestrian agents AT1 and AT2 and the sign system plan 12A of a store T1 correspond to the information illustrated in FIGS. 22 and 23. In the example in FIG. 24A, the pedestrian agent AT1 enters the information transmittable range H1 of the store T1 after the random walk. The store T1 is positioned within the recognition field of view of the pedestrian agent AT1. The simulation management unit 30 starts the process of mode 1. The simulation management unit 30 calculates the degree of coincidence between the destination of the pedestrian agent AT1 and the service information on the store T1. Since the destination "0: wanting to eat hamburger steak" and "perceptual information, 0: smell of western food" have the same numerical value, the simulation management unit 30 calculates the degree of coincidence 1. Here, the predetermined value is assumed as 0.5. Since the degree of coincidence 1 is equal to or greater than 0.5, the simulation management unit 30 sets the store T1 as the moving direction of the pedestrian agent AT1. As a result, the pedestrian behavior execution unit 50 causes the pedestrian agent AT1 to behave so as to enter the store T1.

In the example in FIG. 24B, the pedestrian agent AT2 enters the information transmittable range H1 of the store T1 similarly to the pedestrian agent AT1 in FIG. 24A. The store T1 is positioned within the recognition field of view of the pedestrian agent AT2. The simulation management unit 30 starts the process of mode 1. The simulation management unit 30 calculates the degree of coincidence between the destination of the pedestrian agent AT2 and the service information on the store T1. Since the destination "1: wanting to eat ramen" and "perceptual information, 0: smell of western food" have different numerical values, the simulation management unit 30 calculates the degree of coincidence 0. Since the degree of coincidence 0 is less than the predetermined value 0.5, the simulation management unit 30 does not set the store T1 as the moving direction of the pedestrian agent AT1 and causes the pedestrian agent AT2 to keep the random walk.

Note that, here, the degree of coincidence is assumed as "1" when the numerical value of the service information and the numerical value of the destination are identical to each other, and assumed as "0" when the numerical values are not identical to each other. It is also assumed that the pedestrian agent is caused to enter the store when the degree of coincidence is equal to or greater than 0.5, and the pedestrian agent is not caused to enter the store when the degree of coincidence is less than 0.5. However, the specific numerical values and the calculation method for the degree of coincidence are not limited to the above examples.

FIG. 25 illustrates the cognitive information corresponding to the behavior of the pedestrian agent AT1 in FIGS. 24A and 24B. First, the pedestrian agent AT1 performs the random walk because the pedestrian agent AT1 does not cognize the position of the destination at first. The cognitive information at the time point of the step number "STEP0001" is information acquired from the pedestrian information on the pedestrian agent AT1, such as "destination, 0: wanting to eat hamburger steak", "visual recognition distance, 10," and "viewing angle, 2π". In addition, the moving direction is assigned as "RW" (random walk) because information on the destination is not cognized.

Information regarding the store, such as "store number, T1". "service information, 0: western food", and "perceptual information, 0: smell of western food", is described in the cognitive information when the pedestrian agent AT1 enters the information transmittable range H1 of the store T1 (that when it is determined from the position information that the pedestrian agent AT1 is located within the information transmittable range H1). Then, the simulation management unit 30 calculates the degree of coincidence between the service information on the store and the destination of the pedestrian agent AT1 ((1) in FIG. 25). The calculation of the degree of coincidence may be similar to the calculation in the above embodiment. Then, the degree of coincidence "1" is described in association with the step "STEP0020". Since the degree of coincidence "1" is equal to or greater than the predetermined value 0.5, the store T1 is set as the moving direction. The pedestrian agent AT1 moves toward the store T1. For example, the pedestrian agent A1 enters the store T1.

On the other hand, when a store of which the information transmittable range H1 is entered by the pedestrian agent AT1 in the step "STEP0020" is a store T2, which is a Chinese restaurant, the cognitive information is as illustrated in (2) of FIG. 25. In this case, since the degree of coincidence is 0 and less than 0.5, the simulation management unit 30 does not set the store T2 as the moving direction but keeps RW.

(2) Process in Mode 2 According to Modification

Figure 26A:
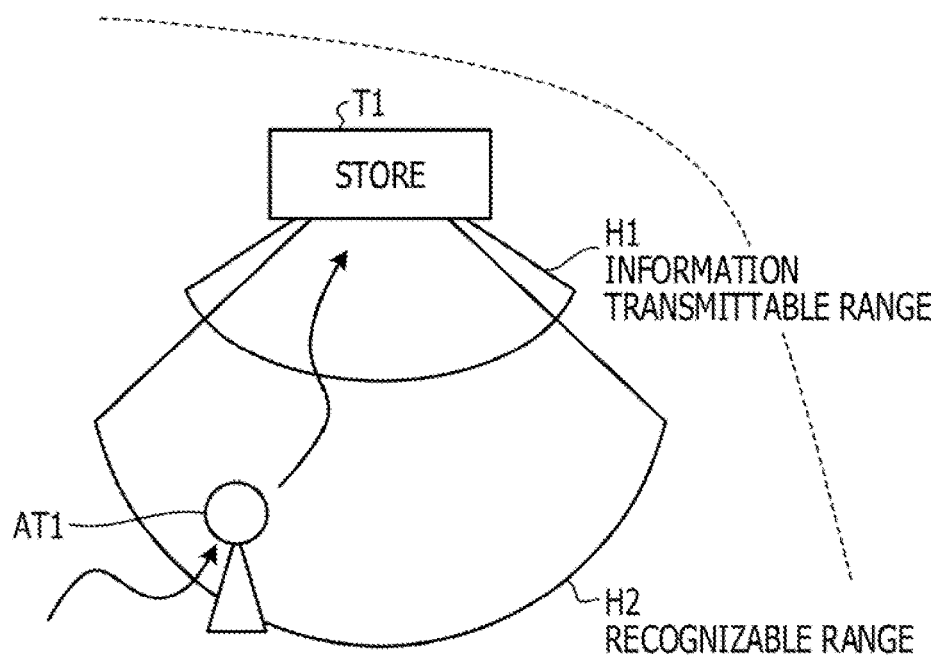
FIG. 26A is an explanatory diagram for explaining the behavior of the pedestrian agent in mode 2 according to the modification.
Figure 26B:
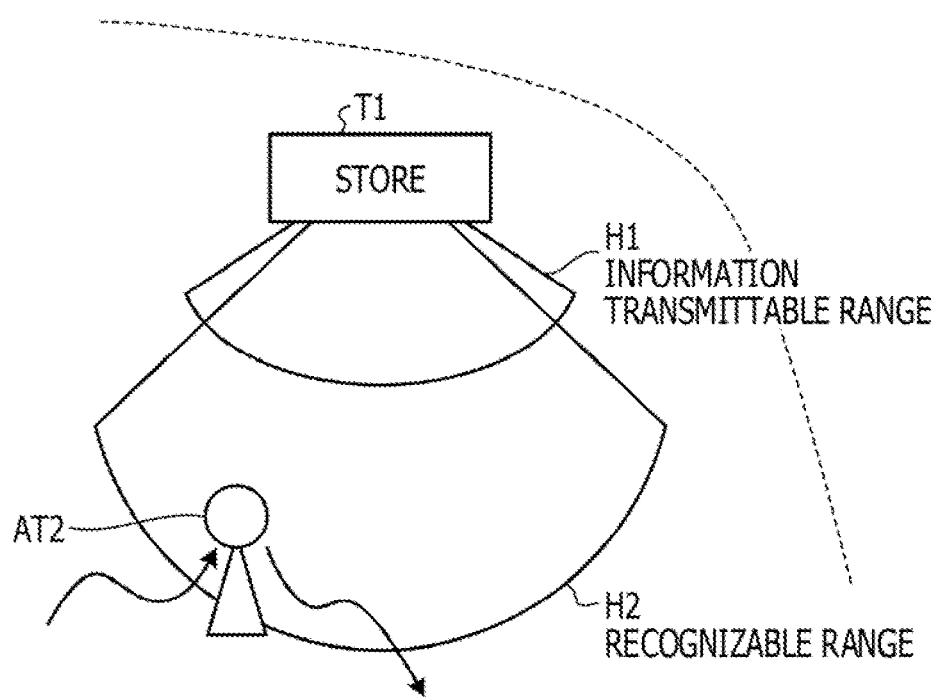
FIG. 26B is an explanatory diagram for explaining the behavior of the pedestrian agent in mode 2 according to the modification.

FIGS. 26A and 26B are explanatory diagrams for explaining the behavior of the pedestrian agents in mode 2 according to the modification. FIG. 27 is an explanatory diagram for explaining the update of the cognitive information on the pedestrian agent in mode 2 according to the modification.

It is assumed that the pedestrian agents AT1 and AT2 and the store T1 correspond to the information illustrated in FIGS. 22 and 23. In the example in FIG. 26A, the pedestrian agent AT1 enters the recognizable range H2 of the store T1 after the random walk. The store T1 is positioned within the recognition field of view of the pedestrian agent AT1. The simulation management unit 30 starts the process of mode 2. The simulation management unit 30 calculates the degree of coincidence between the destination of the pedestrian agent AT1 and the perceptual information on the store T1. Since the destination "0: wanting to eat hamburger steak" and "perceptual information, 0: smell of western food" have the same numerical value, the simulation management unit 30 calculates the degree of coincidence 1. Then, the simulation management unit 30 sets the store T1 as the moving direction of the pedestrian agent AT1. As a result, the pedestrian behavior execution unit 50 causes the pedestrian agent AT1 to behave so as to move in the direction of the store T1.

In the example in FIG. 26B, the pedestrian agent AT2 enters the recognizable range H2 of the store T1 after the random walk. The store T1 is positioned within the recognition field of view of the pedestrian agent AT2. The simulation management unit 30 starts the process of mode 2. The simulation management unit 30 calculates the degree of coincidence between the destination of the pedestrian agent AT2 and the perceptual information on the store T1. Since the destination "1: wanting to eat ramen" and "perceptual information, 0: smell of western food" have different numerical values, the simulation management unit 30 calculates the degree of coincidence 0. Then, the simulation management unit 30 does not set the store T1 as the moving direction of the pedestrian agent AT2, and sets a direction contrary to the store T1 as the moving direction. As a result, the pedestrian behavior execution unit 50 causes the pedestrian agent AT2 to behave so as to move in a direction away from the store T1.

FIG. 27 illustrates the cognitive information corresponding to the behavior of the pedestrian agent AT1 in FIG. 26A. First, the pedestrian agent AT1 performs the random walk because the pedestrian agent. AT1 does not cognize the position of the destination at first. The cognitive information at the time point of the step number "STEP0001" is information acquired from the pedestrian information on the pedestrian agent AT1, such as "destination, 0: wanting to eat hamburger steak", "visual recognition distance, 10," and "viewing angle, $2\pi$". In addition, the moving direction is assigned as "RW" (random walk) because information on the destination is not cognized.

Information regarding the store, such as "store number, T1", "service information, 0: western food", and "perceptual information, 0: smell of western food", is described in the cognitive information when the pedestrian agent AT1 enters the information transmittable range H1 of the store T1. Then, the simulation management unit 30 calculates the degree of coincidence between the perceptual information on the store and the destination of the pedestrian agent ((1) in FIG. 27). Then, the degree of coincidence "1" is described in association with the step "STEP0020". Since the degree of coincidence "1" is equal to or greater than the predetermined value 0.5, the store T1 is set as the moving direction. The pedestrian agent AT1 moves toward the store T1.

On the other hand, it is assumed that a store of which the information transmittable range H1 is entered by the pedestrian agent. AT1 in the step "STEP0020" is the store T2, which is a Chinese restaurant. In this case, the cognitive information is as illustrated in (2) of FIG. 27. In this case, since the degree of coincidence is 0 and equal to or less than 0.5, the simulation management unit 30 does not set the store T2 as the moving direction but assigns a direction contrary to T2 as the moving direction.

Note that the modification is configured such that the moving direction of the pedestrian agent is changed according to the degree of coincidence in both of mode 1 and mode 2. However, the present invention is not limited to this configuration, and also the first modification may be configured such that the cognition form, for example, the viewing angle of the pedestrian agent is changed in the case of mode 2. In addition, also the calculation technique for the degree of coincidence may be similar to the calculation technique of the above embodiment.

Effects of Embodiments

As described above, the simulation device according to the embodiment arranges agents in a virtual space in which a plurality of guidance displays is set, the agents each having cognitive information and behaving in the virtual space based on the cognitive information. The simulation device also sets a first range and a second range different from the first range for each of the plurality of guidance displays. The simulation device changes cognitive information up to a destination of one of the agents, when the one of the agents enters within the first range of one of the guidance displays and first guidance information corresponding to the first range is related with the destination. In addition, the simulation device changes cognitive information not directly related with a destination of one of the agents for the one of the agents, when the one of the agents enters within the second range and second guidance information corresponding to the second range is related with the destination. Therefore, the simulation device according to the embodiment can simulate the behavior of the pedestrian agent according to the level of information acquired from the guidance information by the pedestrian agent. Furthermore, the simulation device according to the embodiment changes the cognitive information when the guidance information is related with the destination of the one of the agents. The simulation device also changes the cognitive information by distinguishing whether the one of the agents has entered within the first range of one of the guidance displays or has entered within the second range of the one of the guidance displays. As a consequence, the simulation device can implement simulation more closely in line with the reality. Additionally, the simulation device according to the embodiment can prevent a fluctuation width of a simulation result from growing larger due to a set condition.

Moreover, the simulation device according to the embodiment changes cognitive information not directly related with a destination of one of the agents for the one of the agents, when, with respect to each of the plurality of guidance displays, the one of the agents enters within the second range different from the first range and wider than the first range, and the second guidance information corresponding to the second range is related with the destination. As a consequence, the simulation device can change the cognitive information in a form in line with the reality by associating a change form of the cognitive information and a plurality of ranges set for each guidance display. Therefore, the simulation device can implement people flow simulation with less fluctuations in accuracy.

In addition, the simulation device according to the embodiment updates the cognitive information on the pedestrian agent by changing a perceptual range of the pedestrian agent, when the pedestrian agent enters the second range. As a consequence, the simulation device can express, in simulation, a state in which the attention of the pedestrian agent is concentrated on predetermined guidance information. Accordingly, the simulation device can implement simulation more closely in line with real human behavior. Furthermore, the simulation device can suppress unnatural fluctuations n the simulation result due to a set condition.

Additionally, the simulation device according to the embodiment updates the cognitive information on the pedestrian agent by changing a viewing angle of the pedestrian agent, when the pedestrian agent enters the second range. As a consequence, the simulation device can express a state in which the attention of the pedestrian agent is concentrated on predetermined guidance information by narrowing the viewing angle and can reflect the expressed state in simulation. Accordingly, the simulation device can implement simulation more closely in line with real human behavior. Furthermore, the simulation device can suppress unnatural fluctuations in the simulation result due to a set condition.

In addition, the simulation device according to the embodiment updates the cognitive information on the pedestrian agent by updating a moving direction of the pedestrian agent to a direction that does not coincide with the second guidance information, when the pedestrian agent enters the second range. As a consequence, the simulation device can reflect, in simulation, the influence of information that cannot be clearly recognized but used as a judgment material by a person. Furthermore, the simulation device can suppress unnatural fluctuations in the simulation result due to a set condition.

Additionally, the simulation device according to the embodiment updates the cognitive information on the pedestrian agent according to a characteristic of the second guidance information, which stimulates a sense of vision, hearing, or smell of the pedestrian agent, or any combination thereof, when the pedestrian agent enters the second range. For example, the simulation device changes the behavior of the pedestrian agent according to information that stimulates a sense of hearing or smell, such as smell of food, smell of perfume, or the like, or music drifting from a store. Therefore, the simulation device can execute the simulation by taking into account not only visual information but also a variety of types of information that affect human behavior. As a consequence, the simulation device can reflect, in simulation, the influence of information that cannot be dearly recognized but used as a judgment material by a person. Furthermore, the simulation device can suppress unnatural fluctuations in the simulation result due to a set condition.

In addition, the simulation device according to the embodiment updates the cognitive information on the pedestrian agent according to a display form of the second guidance information, when the pedestrian agent enters the second range. As a consequence, the simulation device can appropriately evaluate a condition that affects the cognitive information on the pedestrian agent and can reflect the evaluated condition in simulation.

Furthermore, the simulation device according to the embodiment updates the cognitive information on the pedestrian agent according to a degree of coincidence between the first and second guidance information and the cognitive information on the pedestrian agent. As a consequence, the simulation device can provide a simulation result in line with the reality by appropriately setting the pedestrian information (cognitive information) on the pedestrian agent.

Additionally, the simulation device according to the embodiment expresses the destination of the pedestrian agent, the facility information and the guidance intention on the sign, and the like as numerical values. As a consequence, the simulation device can easily calculate the degree of coincidence between the purpose of the pedestrian agent and the sign or the store to implement the simulation. Furthermore, the simulation device can easily execute the simulation for virtual spaces of a variety of settings by setting numerical values for calculation of the degree of coincidence once.

FIGS. 28A to 28D and FIGS. 29A to 29D are diagrams for explaining the advantage of the simulation device according to the embodiment.

Figure 28A:
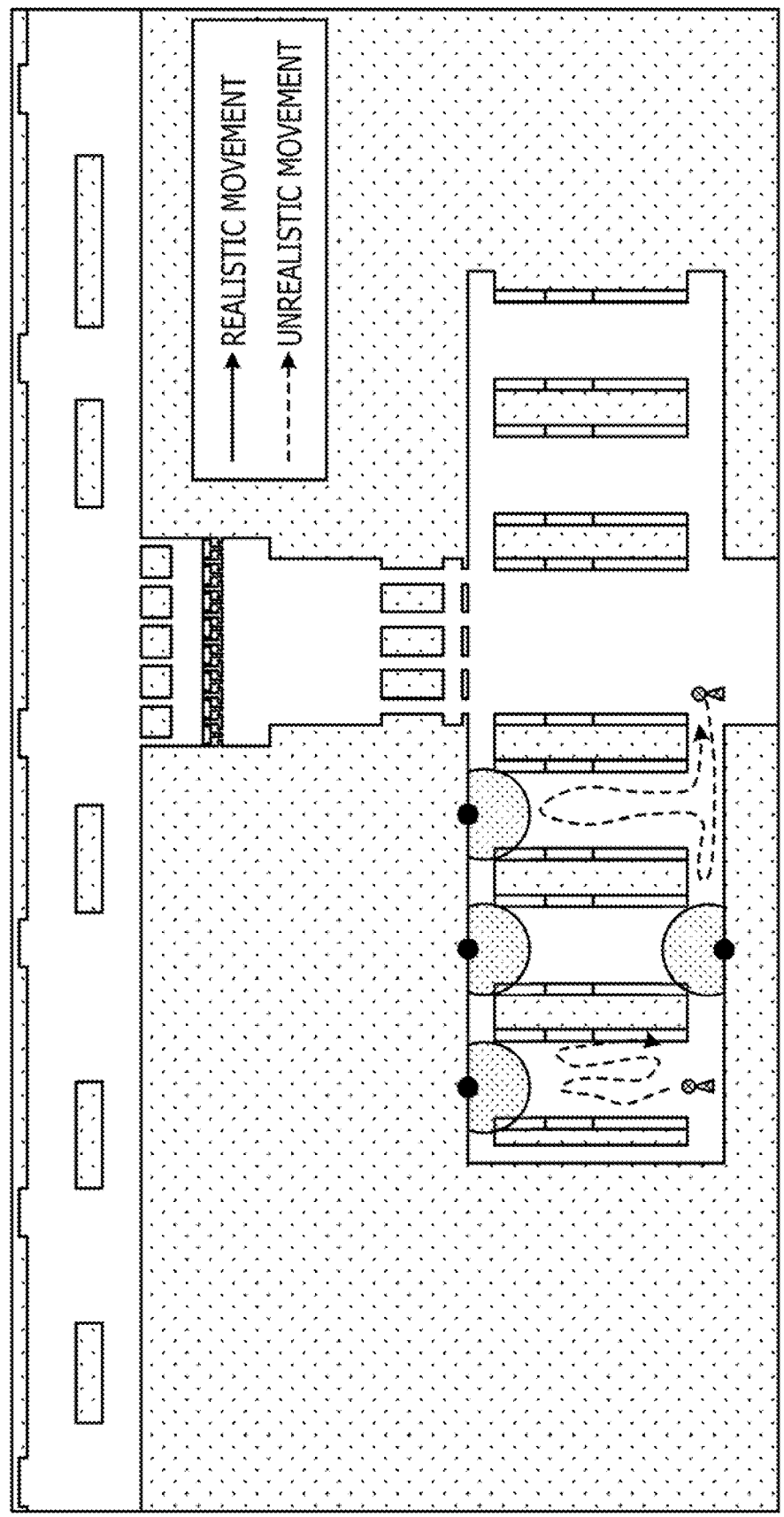
FIG. 28A is a diagram for explaining the advantage of the simulation device according to the embodiment.
Figure 28C:
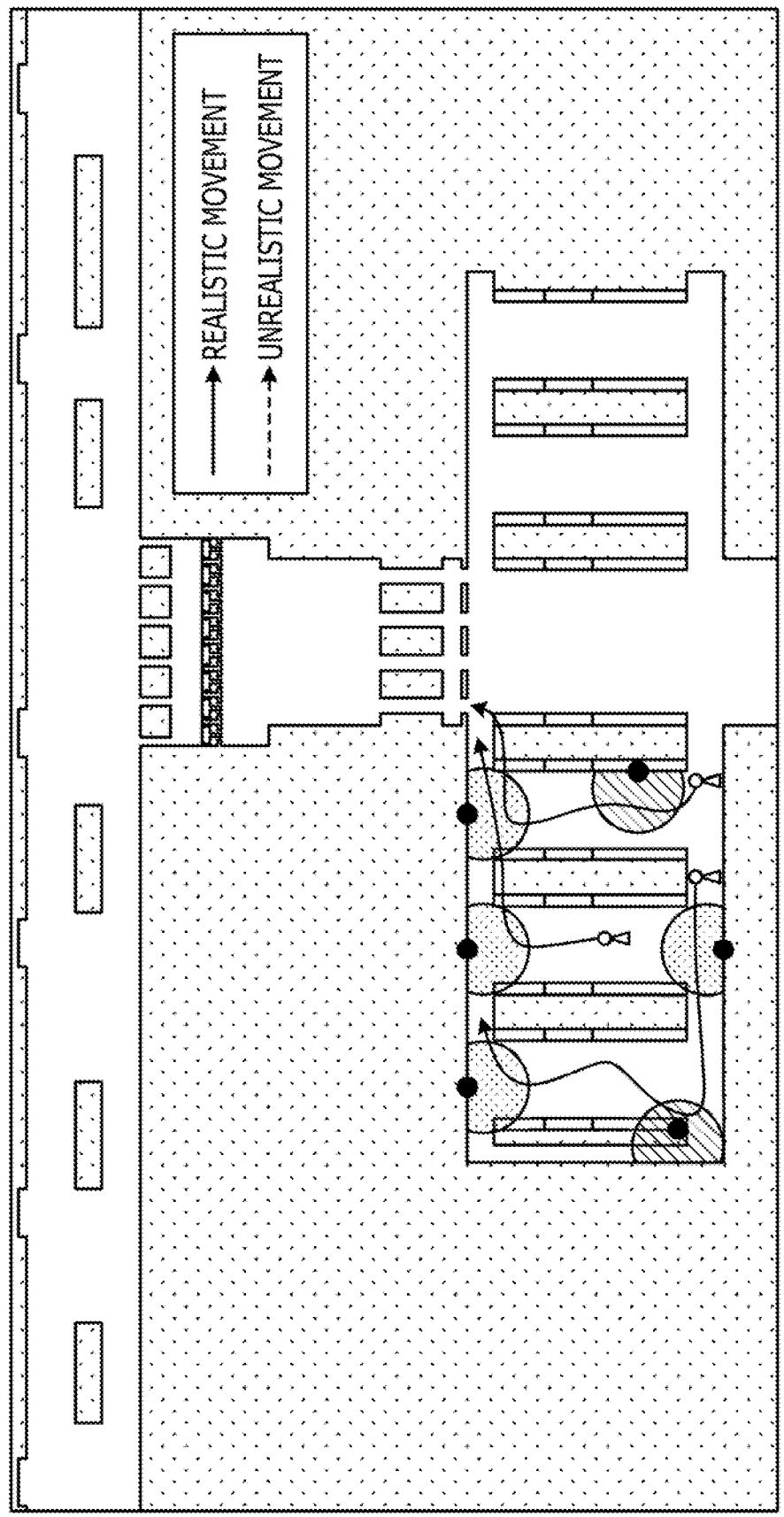
FIG. 28C is a diagram for explaining the advantage of the simulation device according to the embodiment.

FIGS. 28A to 28D illustrate a case where the simulation is executed regardless of the above embodiment. FIG. 28A displays the movement of the pedestrian agents in the case of simulation based on the assumption that the pedestrian agent cognizes the display contents of a sign when entering within a predetermined distance from the sign. As mentioned earlier, the pedestrian agents turn in direction without cognizing the signs even though the pedestrian agents come close to the signs. When this simulation is performed, an operator examines the simulation result and will alter the arrangement of the signs. For example, the operator notes in the example in FIG. 28A that none of the pedestrian agents can reach the sign, and therefore can cognize the destination. Then, as illustrated in FIG. 28B, the number of signs is increased such that the pedestrian agents can cognize the signs reliably. Thereafter, the operator causes the simulation device to execute the simulation again based on the new arrangement. In consequence, a simulation result is obtained in which the pedestrian agents enter within a predetermined distance from the signs and cognize the information (FIG. 28C). Upon obtaining this simulation result, the operator again checks the sign arrangement and further performs evaluation on the actual site (FIG. 28D). As a result, the operator finds that the sign on the center of FIG. 28D, which appears to be necessary in the simulation, does not actually provide information other than the information provided by the left and right signs and is unnecessary. The operator also finds that a person approaching the sign on the left wall surface on the lower side immediately notices the sign on the left end of FIG. 28D and thus the sign on the left wall surface on the lower side is substantially unnecessary. Then, the operator removes the signs judged to be unnecessary at that point.

As described above, when the simulation is performed regardless of the embodiment, the operator goes through the procedure of executing the simulation, evaluating and rearranging the arrangement based on the simulation, and executing the simulation based on conditions after the rearrangement. Furthermore, after the simulation based on conditions after the rearrangement, the operator verifies the simulation result and adjusts the arrangement again. In this manner, in the case of the example in FIGS. 28A to 28D, it takes time and effort to reach an optimum sign arrangement through simulation.

Figure 29A:
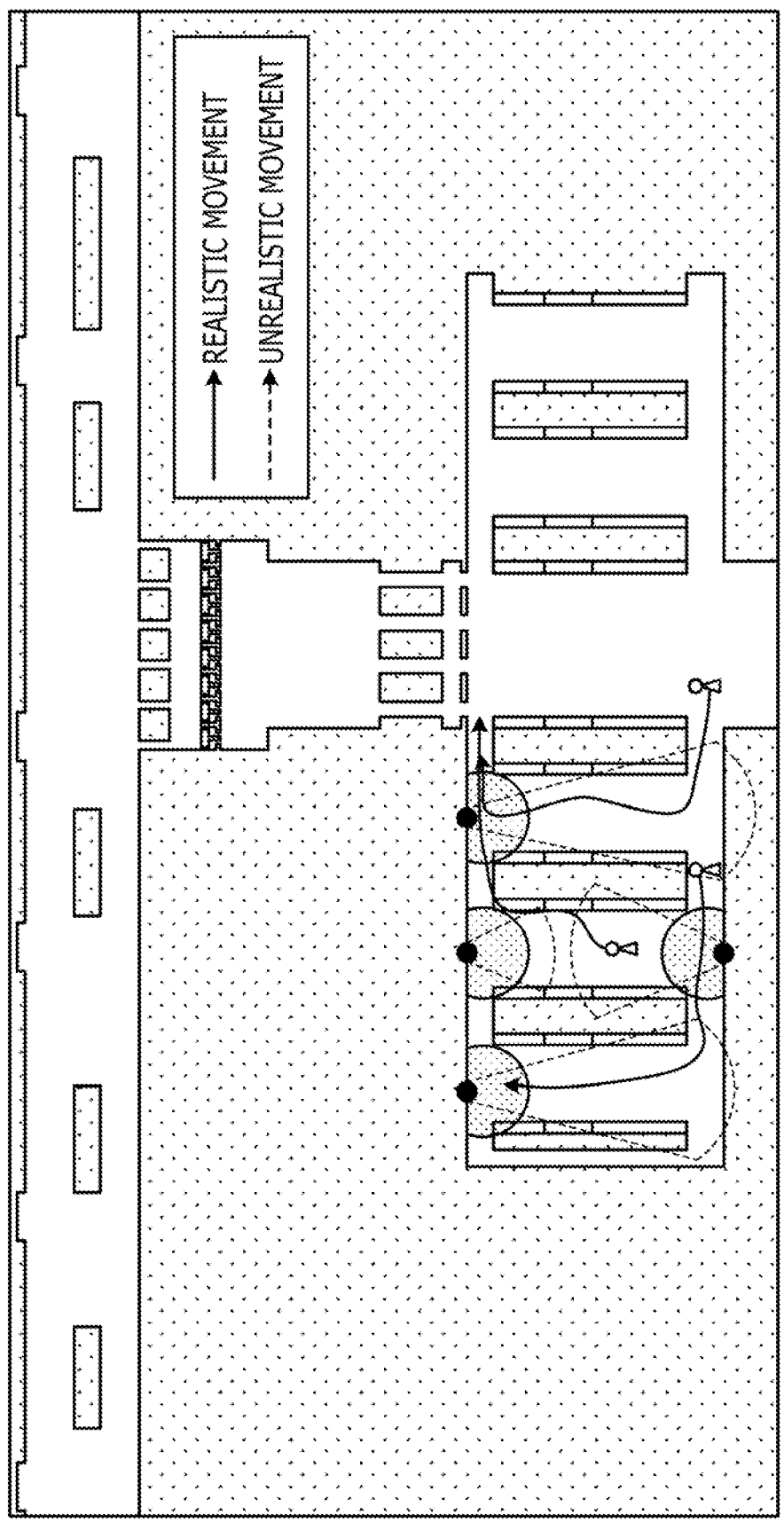
FIG. 29A is a diagram for explaining the advantage of the simulation device according to the embodiment.
Figure 29B:
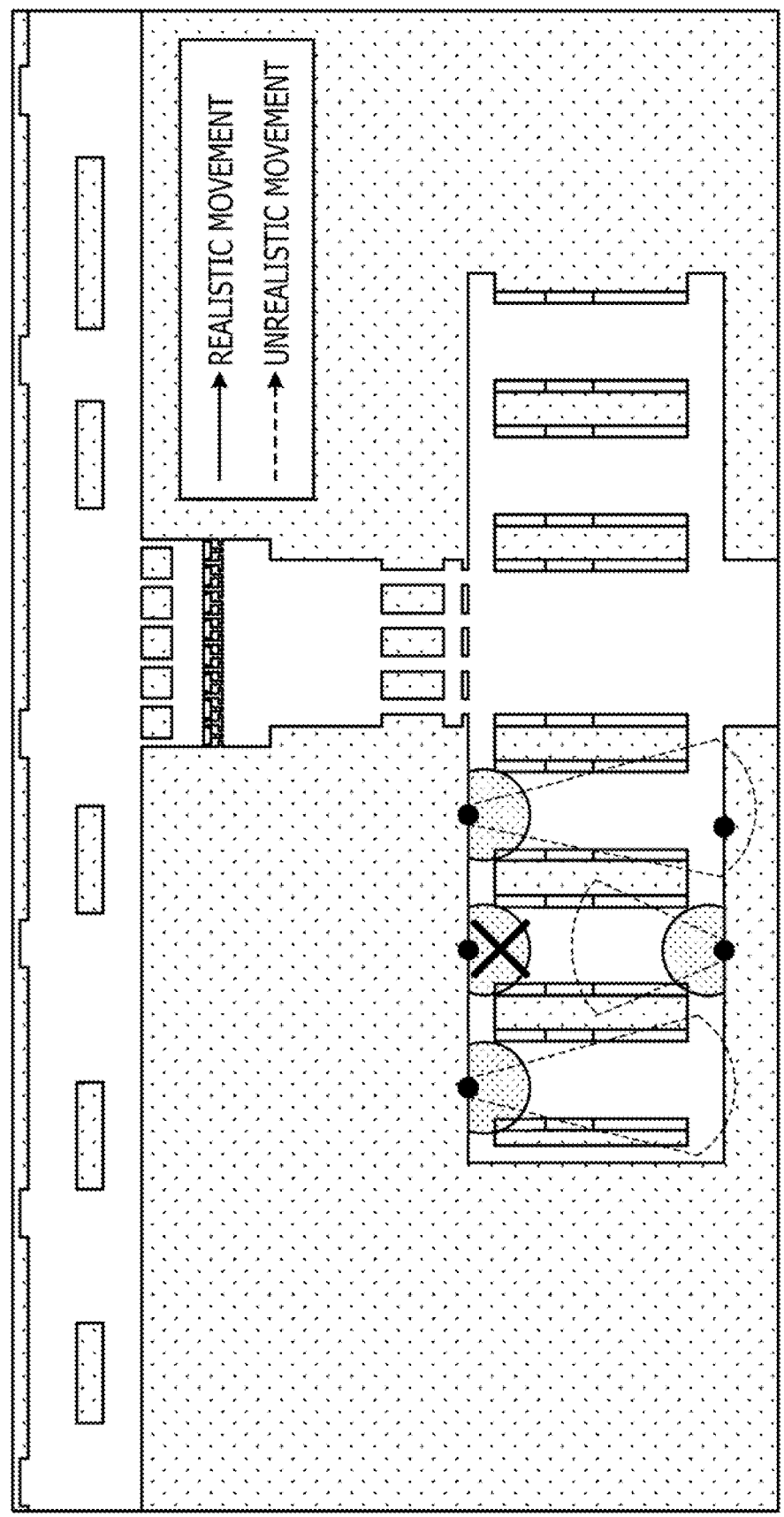
FIG. 29B is a diagram for explaining the advantage of the simulation device according to the embodiment.
Figure 29C:
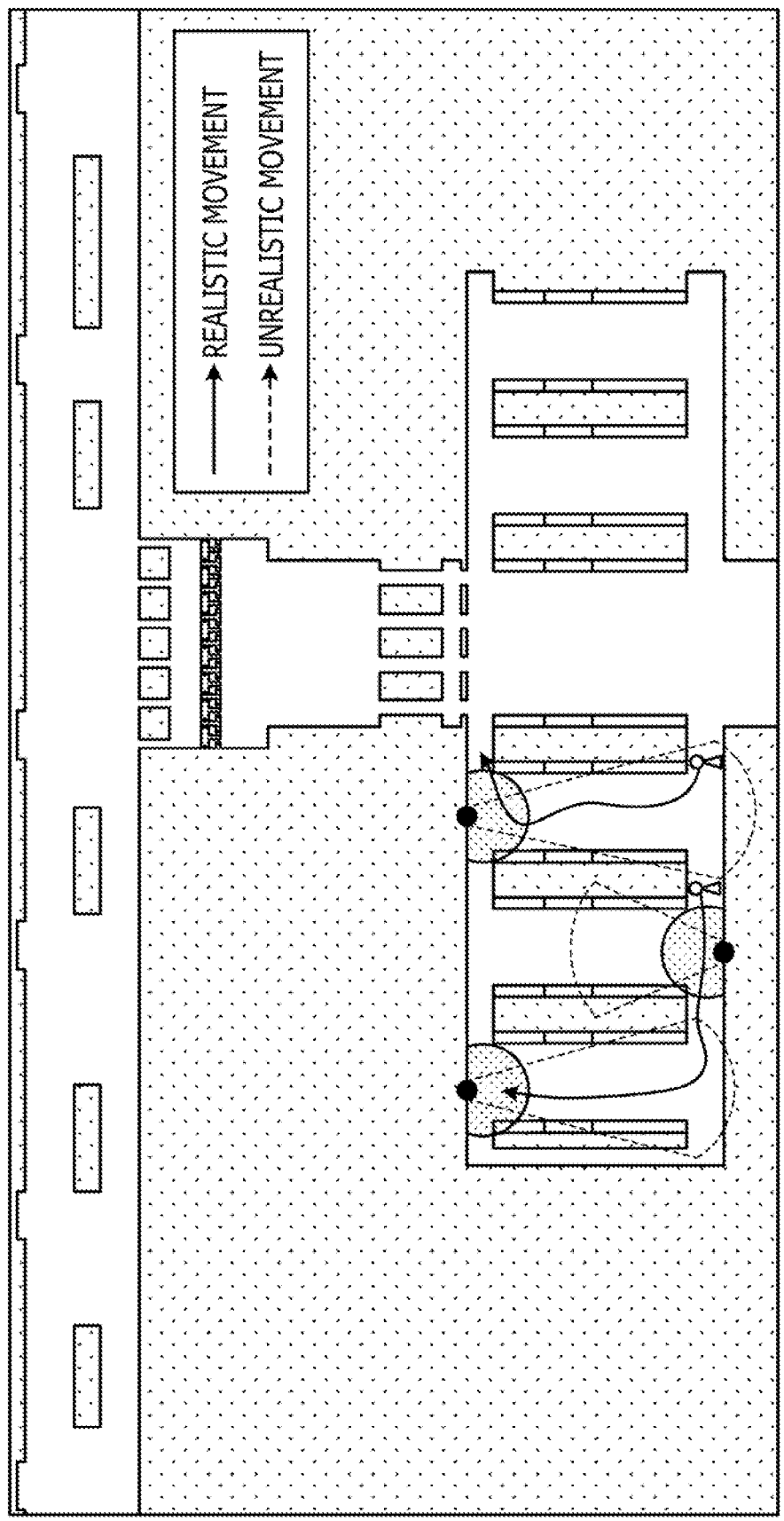
FIG. 29C is a diagram for explaining the advantage of the simulation device according to the embodiment.

In this regard, FIG. 29A illustrates a case where the simulation according to the embodiment is executed using the same arrangement as the arrangement in FIG. 28A. In the case of FIG. 29A, the pedestrian agent cognizes the presence of the sign even from a place separated in distance and goes to confirm the sign. Therefore, the result of a simulation in which all pedestrian agents confirm easily visible signs and move is obtained. Upon obtaining the simulation result, the operator reexamines the arrangement of the signs. As a result, the operator removes a sign in the upper center, noting that this sign is not used by any pedestrian agent to cognize the destination (FIG. 29B). Then, the operator executes the simulation again with an arrangement in which the number of signs is decreased by one (FIG. 29C). Thereafter, the operator finally evaluates the simulated arrangement on the site (FIG. 29D). As a result, in the example in FIG. 28D, the sign arranged on the right wall surface on the lower side is reduced. In addition, the number of signs can be suppressed before a person finally makes a judgment. For this reason, while a useless arrangement of a sign can be eliminated, the time and effort until reaching an optimum sign arrangement through simulation can be suppressed. As described above, according to the simulation of the embodiment, the computation cost of the simulation itself can be relaxed, and the labor and time cost until reaching an optimum arrangement can also be significantly lowered. Furthermore, according to the simulation of the embodiment, an unrealistic movement of the pedestrian agent is excluded, and fluctuations in the simulation result are suppressed.

Other Modifications

Note that, in the above embodiment, two display forms, that is, the map type and the arrow type have been described as variations of the display form of the sign. However, besides these variations, it is possible to set the behavior change of the pedestrian agent based on diverse display forms such as the size of the sign, and the color, the shape, and the dimensions of the graphic or characters displayed on the sign. For example, a sign in which a predetermined product is displayed in a large size, or a sign in which a predetermined food material is displayed in a large size can be visually recognized from a distance with ease. In addition, it is also possible to make detailed settings such as distinguishing pedestrian agents whose attention is drawn in response to the color of a sign, by pedestrian classification.

Furthermore, in the above embodiment, the information provided by the sign and the store as the guidance information has been described as an example; however, it is also possible to similarly evaluate, in the simulation, an object emitting information that affects human behavior, other than the sign and the store. For example, a speaker playing background music, a stand selling food and the like, and a lighting device whose lighting form changes are considered as objects emitting information that affects human behavior.

Simulation Program

All or any part of the various processing functions to be performed by the simulation device 1 may be executed by a central processing unit (CPU) (or a microcomputer such as a micro processing unit (MPU) or a micro controller unit (MCU)). Furthermore, it is needless to say that whole or any part of various processing functions may be executed by a program to be analyzed and executed on a CPU (or a microcomputer, such as an MPU or an MCU), or on hardware by wired logic. In addition, part of the functional blocks may be implemented by another computer.

Figure 30:
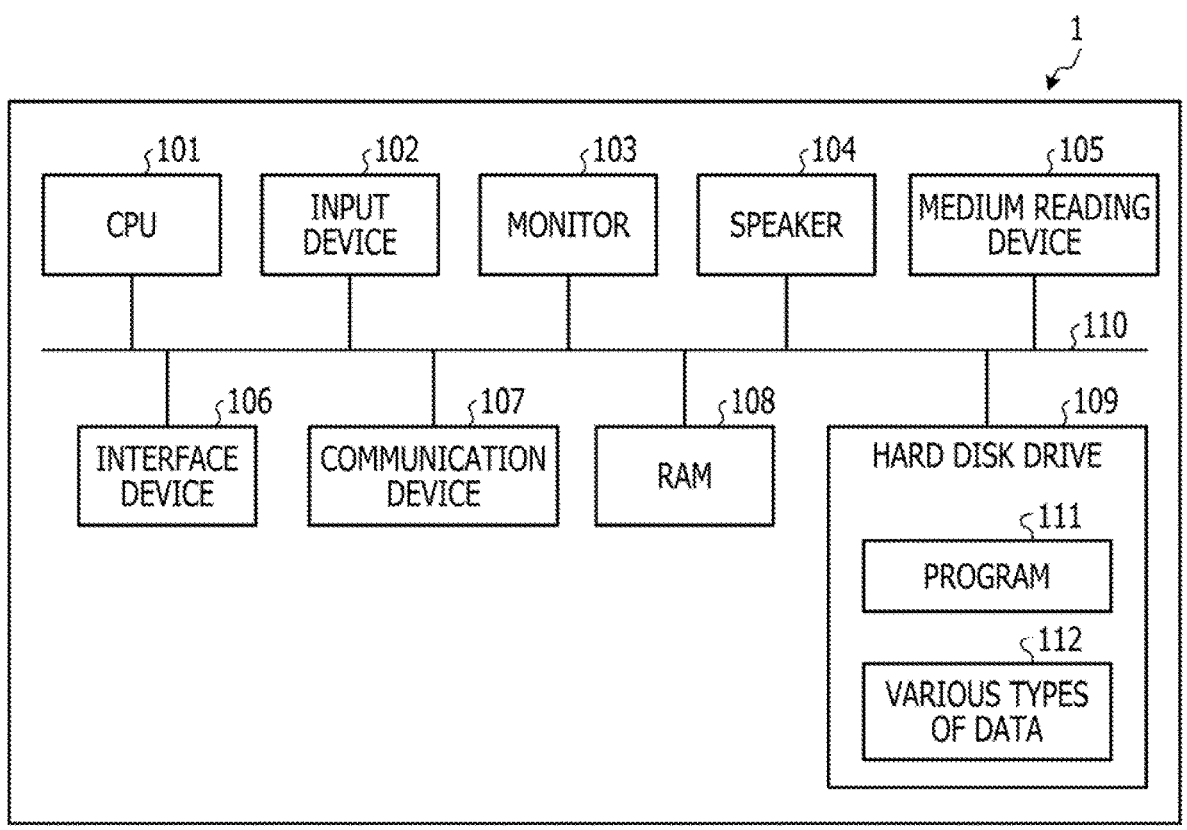
FIG. 30 is a block diagram illustrating an example of a hardware configuration of the simulation device according to the embodiment.

Meanwhile, the various types of processing described in the above embodiment can be achieved by execution of a prepared program on a computer. Thus, there will be described below an example of a computer (hardware) that executes a program with functions similar to the functions in the above embodiment. FIG. 30 is a block diagram illustrating an example of a hardware configuration of the simulation device 1 according to the embodiment.

As illustrated in FIG. 30, the simulation device 1 includes a CPU 101 that executes various types of arithmetic processing, an input device 102 that receives data input, a monitor 103, and a speaker 104. In addition, the simulation device 1 includes a medium reading device 105 that reads a program and the like from a storage medium, an interface device 106 that is used for connecting to various devices, and a communication device 107 that makes communicative connection with an external device in a wired or wireless manner. Furthermore, the simulation device 1 includes a RAM 108 which temporarily stores various types of information and a hard disk drive 109. Additionally, each part (101 to 109) in the simulation device 1 is connected to a bus 110.

The hard disk drive 109 stores a program 111 that executes various types of processing described in the above embodiment. In addition, the hard disk drive 109 stores various types of data 112 to which the program 111 refers. The input device 102 receives, for example, an input of operation information from an operator of the simulation device 1. The monitor 103 displays, for example, various screens operated by the operator. The interface device 106 is connected to, for example, a printing device. The communication device 107 is connected to a communication network such as a local area network (LAN), and exchanges various types of information with the external device via the communication network.

The CPU 101 reads the program 111 stored in the hard disk drive 109 and loads the program 111 into the RAM 108 to execute the program 111. Then, the CPU 101 executes the various types of processing. Note that, the program 111 may not be prestored in the hard disk drive 109. For example, the program 111 stored in a storage medium which can be read by the simulation device 1 may be read and executed by the simulation device 1. The storage medium which can be read by the simulation device 1 corresponds to, for example, a portable recording medium such as a compact disc read only memory (CD-ROM), a digital versatile disc (DVD) disk, and an universal serial bus (USB) memory, a semiconductor memory such as a flash memory, a hard disk drive, and the like. Alternatively, this program may be prestored in a device connected to a public line, the Internet, a LAN, or the like, and the simulation device 1 may read the program from the device to execute the program.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium recording a simulation program for causing a computer to execute a process comprising:
    arranging an agent, which has cognitive information and behaves in a virtual space based on the cognitive information, in the virtual space in which a plurality of facilities and a plurality of guidance display are set;
    determining whether a guidance display of the plurality of guidance displays is present within a recognition field of view of an agent of the agents;
    determining whether the agent is located within a first range in which information of the guidance display is transmittable and first guidance information is obtained when determining that the guidance display is present within the recognition field;
    determining whether the agent is located within a second range in which the guidance display is recognizable and second guidance information is obtained when determining that the agent is not located within the first range;
    performing a first update process of the cognitive information of the agent when determining that the agent is located within the first range, wherein the first update process includes:
    calculating a first degree of coincidence between facility information of the first guidance information and a destination of the agent;
    updating the cognitive information of the agent with the first degree of coincidence;
    determining whether the first degree of coincidence is equal to or greater than a predetermined value;
    designating a facility of the facility information as a moving direction of the agent when determining that the first degree of coincidence is equal to or greater than the predetermined value; and
    not-changing the moving direction when determining that the first degree of coincidence is not equal to or greater than the predetermined value,
    performing a second update process of the cognitive information of the agent when determining that the agent is located within the second range, wherein the second update process includes:
    calculating a second degree of coincidence between the second guidance information and the destination of the agent;
    updating the cognitive information of the agent based on the second degree of coincidence; and
    designating the moving direction of the agent.

2. The non-transitory computer-readable recording medium according to claim 1, wherein the second range is wider than the first range.

3. The non-transitory computer-readable recording medium according to claim 1, wherein the cognitive information of the agent is updated by changing a perceptual range of the agent, when the agent enters the second range.

4. The non-transitory computer-readable recording medium according to claim 3, wherein the cognitive information of the agent is updated by changing a viewing angle of the agent, when the agent enters the second range.

5. The non-transitory computer-readable recording medium according to claim 1, wherein the cognitive information of the agent is updated by updating a moving direction of the agent to a direction that does not coincide with the second guidance information, when the agent enters the second range.

6. The non-transitory computer-readable recording medium according to claim 1, wherein the cognitive information of the agent is updated according to a characteristic of the second guidance information, which stimulates at least one of a sense of vision, a sense of hearing, or a sense of smell of the agent when the agent enters the second range.

7. The non-transitory computer-readable recording medium according to claim 6, wherein the cognitive information of the agent is updated according to a display form of the second guidance information, when the agent enters the second range.

8. A simulation method comprising:
    arranging, by a computer, an agent, which has cognitive information and behaves in a virtual space based on the cognitive information, in the virtual space in which a plurality of facilities and a plurality of guidance display are set;
    determining whether a guidance display of the plurality of guidance displays is present within a recognition field of view of an agent of the agents;
    determining whether the agent is located within a first range in which information of the guidance display is transmittable and first guidance information is obtained when determining that the guidance display is present within the recognition field;
    determining whether the agent is located within a second range in which the guidance display is recognizable and second guidance information is obtained when determining that the agent is not located within the first range;
    performing a first update process of the cognitive information of the agent when determining that the agent is located within the first range, wherein the first update process includes:
    calculating a first degree of coincidence between facility information of the first guidance information and a destination of the agent;
    updating the cognitive information of the agent with the first degree of coincidence;
    determining whether the first degree of coincidence is equal to or greater than a predetermined value;
    designating a facility of the facility information as a moving direction of the agent when determining that the first degree of coincidence is equal to or greater than the predetermined value; and
    not-changing the moving direction when determining that the first degree of coincidence is not equal to or greater than the predetermined value,
    performing a second update process of the cognitive information of the agent when determining that the agent is located within the second range, wherein the second update process includes:

calculating a second degree of coincidence between the second guidance information and the destination of the agent;

updating the cognitive information of the agent based on the second degree of coincidence; and designating the moving direction of the agent.

9. An information processing device comprising:

a memory;

a processor coupled to the memory and configured to:

arrange an agent, which has cognitive information and behaves in a virtual space based on the cognitive information, in the virtual space in in which a plurality of facilities and a plurality of guidance display are set;

determine whether a guidance display of the plurality of guidance displays is present within a recognition field of view of an agent of the agents;

determine whether the agent is located within a first range in which information of the guidance display is transmittable and first guidance information is obtained when determining that the guidance display is present within the recognition field;

determine whether the agent is located within a second range in which the guidance display is recognizable and second guidance information is obtained when determining that the agent is not located within the first range;

perform a first update process of the cognitive information of the agent when determining that the agent is located within the first range, wherein the first update process includes:

calculate a first degree of coincidence between facility information of the first guidance information and a destination of the agent;

update the cognitive information of the agent with the first degree of coincidence;

determine whether the first degree of coincidence is equal to or greater than a predetermined value;

designate a facility of the facility information as a moving direction of the agent when determining that the first degree of coincidence is equal to or greater than the predetermined value; and not-change the moving direction when determining that the first degree of coincidence is not equal to or greater than the predetermined value, perform a second update process of the cognitive information of the agent when determining that the agent is located within the second range, wherein the second update process includes:

calculate a second degree of coincidence between the second guidance information and the destination of the agent;

update the cognitive information of the agent based on the second degree of coincidence; and designate the moving direction of the agent.

* * * * *